United States Patent
Yoneda et al.

(10) Patent No.: US 7,639,297 B2
(45) Date of Patent: Dec. 29, 2009

(54) IMAGE PICKUP APPARATUS

(75) Inventors: Tomoya Yoneda, Tokyo (JP); Shunsuke Inoue, Kanagawa (JP); Tetsunobu Kochi, Kanagawa (JP); Hidekazu Takahashi, Kanagawa (JP); Masanori Ogura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 797 days.

(21) Appl. No.: 11/198,232

(22) Filed: Aug. 8, 2005

(65) Prior Publication Data

US 2005/0270395 A1  Dec. 8, 2005

Related U.S. Application Data

(62) Division of application No. 09/973,054, filed on Oct. 10, 2001, now Pat. No. 6,952,228.

(30) Foreign Application Priority Data

Oct. 13, 2000 (JP) ............................ 2000-313937
Oct. 19, 2000 (JP) ............................ 2000-319630
Nov. 16, 2000 (JP) ............................ 2000-349869

(51) Int. Cl.
*H04N 3/14* (2006.01)
*H04N 5/225* (2006.01)

(52) U.S. Cl. .................... 348/308; 348/304; 348/340

(58) Field of Classification Search ............... 348/300, 348/303, 304
See application file for complete search history.

(56) References Cited

U.S. PATENT DOCUMENTS

| | | | | |
|---|---|---|---|---|
| 4,323,925 A * | 4/1982 | Abell et al. | .................. | 348/340 |
| 5,436,662 A | 7/1995 | Nagasaki et al. | ............. | 348/312 |
| 5,610,390 A * | 3/1997 | Miyano | ....................... | 250/216 |
| 5,694,165 A | 12/1997 | Yamazaki et al. | ........ | 348/218.1 |

(Continued)

FOREIGN PATENT DOCUMENTS

CN  1213249 A  4/1999

(Continued)

OTHER PUBLICATIONS

European Search Report in Application No. 01308692.1 (Feb. 10, 2004).

(Continued)

*Primary Examiner*—Luong T Nguyen
(74) *Attorney, Agent, or Firm*—Fitzpatrick, Cella, Harper & Scinto

(57) ABSTRACT

An image pickup apparatus is provided, which comprises a plurality of image pickup areas formed on a same semiconductor chip and arranged in the horizontal and the vertical directions, each image pickup area having a plurality of pixels arranged in the horizontal and the vertical directions, a plurality of vertical scanning circuits which sequentially scan pixels in the vertical direction to scan a plurality of image pickup areas in the vertical direction independently from each other, a plurality of lenses, at least one of which is provided in each of the plurality of image pickup areas and which focuses light to form an image on the image pickup areas, and a driving circuit which drives the plurality of vertical scanning circuits so that at least a part of a scanning period of each of the plurality of vertical scanning circuits overlaps with each other.

2 Claims, 17 Drawing Sheets

U.S. PATENT DOCUMENTS

| | | | |
|---|---|---|---|
| 5,742,659 A | 4/1998 | Atac et al. | 378/98.8 |
| 5,896,172 A | 4/1999 | Korthout et al. | 348/248 |
| 5,969,759 A | 10/1999 | Morimoto | 348/311 |
| 6,137,535 A * | 10/2000 | Meyers | 348/340 |
| 6,337,713 B1 | 1/2002 | Sato | 348/311 |
| 6,567,189 B1 | 5/2003 | Takayama et al. | 358/241 |
| 6,765,617 B1 * | 7/2004 | Tangen et al. | 348/340 |
| 6,833,873 B1 * | 12/2004 | Suda | 348/340 |
| 6,839,084 B1 | 1/2005 | Hiyama et al. | 248/241 |

FOREIGN PATENT DOCUMENTS

| | | |
|---|---|---|
| CN | 1261687 A | 8/2000 |
| EP | 0 893 915 A2 | 1/1999 |
| JP | 62-11264 | 1/1987 |
| JP | 10275906 | 10/1998 |
| JP | 10336529 | 12/1998 |

OTHER PUBLICATIONS

Toshiki Seto, et al., Performance of 1M-IRCSD Imager with PtSi Schottky-barrier detectors, SPIE vol. 2020 Infrared Technology XIX (1993), pp. 404-414.

Office Action (in English) from counterpart application 01130198.8 from Patent Office in China, dated Mar. 26, 2004.

* cited by examiner

IMAGE FORMATION CENTER OF IMAGE PICKUP LENS

EFFECTIVE PIXEL RANGE IN CASE THAT IMAGE FORMATION CENTER OF IMAGE PICKUP LENS AND CENTER OF PIXEL GROUP ARE LOCATED ON SAME HORIZONTAL LINE

EFFECTIVE PIXEL RANGE IN CASE THAT IMAGE FORMATION CENTER OF IMAGE PICKUP LENS AND CENTER OF PIXEL GROUP ARE LOCATED ON SAME VERTICAL LINE

IMAGE PICKUP APPARATUS

This application is a division of application Ser. No. 09/973,054, filed Oct. 10, 2001.

BACKGROUND OF THE INVENTION

1. Field of the Invention

The present invention relates to an image pickup apparatus for picking up an image of a subject.

2. Related Background Art

An example of a configuration of a conventional solid-state image pickup element is shown in FIG. 1. In the figure, reference numeral 101 denotes pixels having a photoelectric conversion portion such as a photo diode. A pixel area 100 on which an image of a subject is picked up is formed by arranging these pixels two-dimensionally.

In addition, reference numeral 103 denotes vertical signal lines to which signals from the pixels 101 are read out, 104 denotes storage capacitors for temporarily accumulating signals read out to the vertical signal lines 103 from the pixels 101, 105 denotes transfer MOS transistors for transferring the signals read out to the vertical signal lines 103 to the storage capacitors 104, and 106a and 106b denote transfer MOS transistors for transferring signals in the storage capacitors 104 to horizontal signal lines 107.

Moreover, reference numeral 108 denotes a vertical scanning circuit for scanning sequentially in the vertical direction each line of pixels 101 in the horizontal direction, thereby controlling to read out signals to the vertical signal line 103 from the pixels 101 on each line basis. Reference symbols 109a and 109b denote horizontal scanning circuits for controlling the transfer MOS transistors 106a and 106b, thereby sequentially reading out the signals accumulated in the storage capacitor 104 to horizontal signal lines 107a and 107b. Reference symbols 110a and 109b denote a reset MOS transistor for resetting the horizontal signal lines 107a and 107b. In addition, reference numeral 107 denotes load current sources for forming transistors and source followers included in the pixels 101.

Here, an arrangement of color filters for a conventional solid-state image pickup element will be described. FIG. 2 shows an example of the arrangement, where reference numeral 121 denotes first color filters for transmitting red light, 122 denotes second color filters for transmitting green light, and 123 denotes third color filters for transmitting blue light.

The first color filters 121 and the second color filters 122 are alternately arranged in odd columns starting from the first column of the pixel 101, and the second color filters 122 and the third color filters 123 are alternately arranged in even columns starting from the second column of the pixel 101, which color filters correspond to each of the pixels arranged two-dimensionally. Moreover, the second color filters 122 are arranged such that those in the odd columns and those in the even columns are not adjacent with each other in the horizontal direction.

The conventional solid-state image pickup element has the pixel area 100 in which a plurality of color filters are arranged as shown in FIG. 2. However, with this method, for example, if a solid-state image pickup element having 640 pixels horizontally and having 480 pixels vertically at a pixel pitch of 10 μm is used, a focal distance of a lens giving its standard angle of view is 8 mm that is a diagonal length of the solid-state image pickup element.

Therefore, there is a limitation in making the image pickup apparatus thinner, such as a digital camera upon manufacturing the apparatus using such solid-state image pickup elements.

FIG. 3 shows a solid-state image pickup element that is disclosed in Japanese Patent Application Laid-open No. 62-11264. In FIG. 3, solid-state image pickup areas 2 to 4 for picking up images of three color components of R, G and B are formed in one silicon chip 1. Next, configurations and operations of the image pickup areas 2 to 4 will be described using the image pickup area 2 as an example.

In the image pickup area 2, pixels 20 consisting of photodiodes 21 and transistors 22 for transferring signals generated in the photodiodes 21 to vertical output lines 23 are arranged in the horizontal and the vertical directions. Signals outputted to the vertical output lines 23 are sequentially outputted from output terminals 25 via horizontal output lines by transistors 24 that are on/off controlled by a horizontal shift register 27.

In addition, the three image pickup areas 2 to 4 are driven by a vertical shift register 14 via common reading-out drive line 12.

However, since image pickup areas are arranged one-dimensionally in one direction in the above-described conventional solid-state image pickup element, a chip size increases in one direction and a problem arises in making the image pickup element compact.

In addition, if an image of a subject is divided into three images by a lens and the images are picked up in respective image pickup areas, since an image pickup area 2 and an image pickup area 4 are spaced apart, deviation of images of the subject is caused.

Moreover, since a distance to a vertical shift register is different in each image pickup area, a control signal to be transmitted in a reading-out drive line has a decreased signal level due to a voltage drop if it is supplied to an image pickup area that is far apart from the vertical shift register. As a result, a level of a read out signal may vary to cause shading or color drift in an image that is finally obtained.

SUMMARY OF THE INVENTION

The present invention has been devised in view of the above-mentioned drawbacks, and it is an object of the present invention to reduce a lag of time for accumulating photocharges among image pickup areas.

In addition, it is another object of the present invention to obtain an image with less shading.

In order to attain the above-mentioned objects, according to one aspect of the present invention, an image pickup apparatus is provided, which comprises:

a plurality of image pickup areas formed on a same semiconductor chip and arranged in the horizontal and the vertical directions, each image pickup area having a plurality of pixels arranged in the horizontal and the vertical directions and a distance between adjacent image pickup areas being larger than a distance between pixels in a same image pickup area;

a plurality of vertical scanning circuits adapted to sequentially scan pixels in the vertical direction to scan a plurality of image pickup areas in the vertical direction independently from each other; and a horizontal scanning circuit provided in common for a plurality of image pickup areas in the vertical direction, adapted to read out signals.

In addition, according to another aspect of the present invention, an image pickup apparatus is provided, which comprises:

a plurality of image pickup areas formed on a same semiconductor chip and arranged in the horizontal and the vertical directions, each image pickup area having a plurality of pixels arranged in the horizontal and the vertical directions; and a plurality of vertical scanning circuits adapted to sequentially scan pixels in the vertical direction to scan a plurality of image pickup areas in the vertical direction independently from each other;

wherein the plurality of vertical scanning circuits are provided so as to be adjacent to at least one side of each of the plurality of image pickup areas.

Other objects, features and advantages of the invention will become apparent from the following detailed description taken in conjunction with the accompanying drawings.

BRIEF DESCRIPTION OF THE DRAWINGS

The accompanying drawings, which are incorporated in and constitute a part of the specification, illustrate embodiments of the present invention and, together with the description, serve to explain the principles of the present invention, in which.

DESCRIPTION OF THE PREFERRED EMBODIMENTS

Preferred embodiments of the present invention will be hereinafter described with reference to the drawings.

Figure 4:
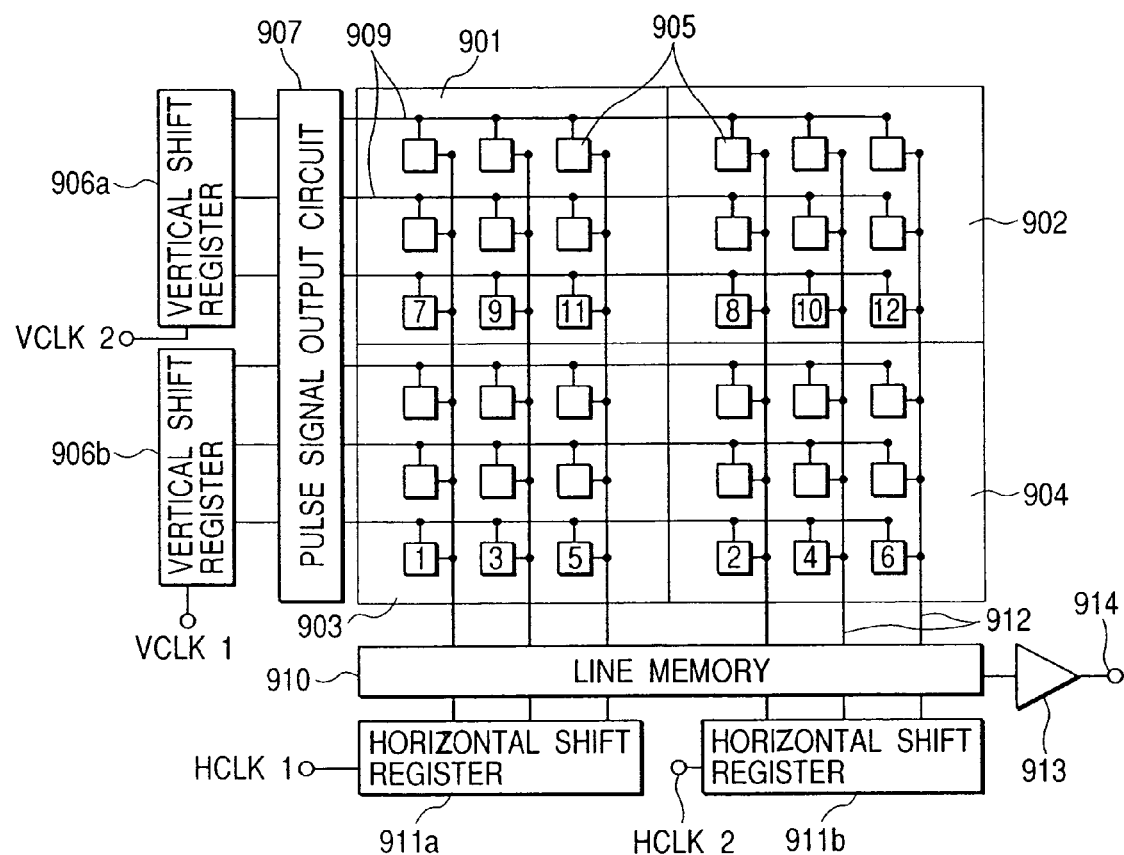
FIG. 4 is a schematic view showing a configuration of a solid-state image pickup element in accordance with a first embodiment of the present invention.

FIG. 4 is a schematic view showing a configuration of a solid-state image pickup element of a first embodiment of the present invention, components of which are formed on a same semiconductor chip by, for example, a CMOS process. In FIG. 4, reference numeral 905 denotes pixels having a photo diode, 901 to 904 denote image pickup areas in which the pixels 905 are arranged two-dimensionally and R, G1, G2 and B filters for forming an image, respectively, are provided, 906a denotes a vertical shift register for outputting a control signal which is generated for controlling pixel scanning in the vertical direction in the image pickup areas 901 and 902, in accordance with a clock signal VCLK2 that is inputted from the outside, 906b denotes a vertical shift register that is signal supplying means for outputting a control signal which is generated for controlling pixel scanning in the vertical direction in the image pickup areas 903 and 904, in accordance with a clock signal VCLK1 that is inputted from the outside, 907 denotes a pulse signal output circuit for outputting a pulse signal that drives the pixels 905 including a charge or a reading-out pulse for reading out an amplified signal based on charges from the inside of the pixels 905 in response to a control signal to be outputted from the vertical shift registers 906a and 906b, 909 denotes horizontal signal lines for transmitting a pulse signal to be outputted from the pulse signal output circuit 907 to each pixel 905, 912 denotes a vertical signal line for transmitting charges or the like read out from each pixel 905, 910 denotes a line memory for retaining the transmitted charge or the like for each line, 911a denotes a horizontal shift register for generating a control signal to sequentially output the charges read out from the image pickup areas 901 and 903 among the charges or the like regained in the line memory 910 to an external processing circuit, and outputting the control signal in accordance with a clock signal HCLK1 to be inputted from the outside, 911b denotes a horizontal shift register that is read-out means for generating a control signal to sequentially output the charges read out from the image pickup areas 902 and 904 among the charges or the like retained in the line memory 901 to the external processing circuit, and outputting the control signal in accordance with a clock signal HCLK2 to be inputted from the outside, 913 denotes an amplifier that is an output unit for amplifying the charges or the like outputted form the line memory 910, and 914 denotes an output terminal for outputting the amplified charges or the like to the processing circuit.

Further, although pixels of three rows and three columns are shown in the image pickup areas 901 to 904, respectively, in FIG. 4, in order to avoid complexity, in practice, a plurality of pixels according to required resolution are arranged both in the horizontal direction and the vertical direction. In addition, a number given to each pixel 905 refers to an order of reading out the charges or the like as described later.

Figure 5:
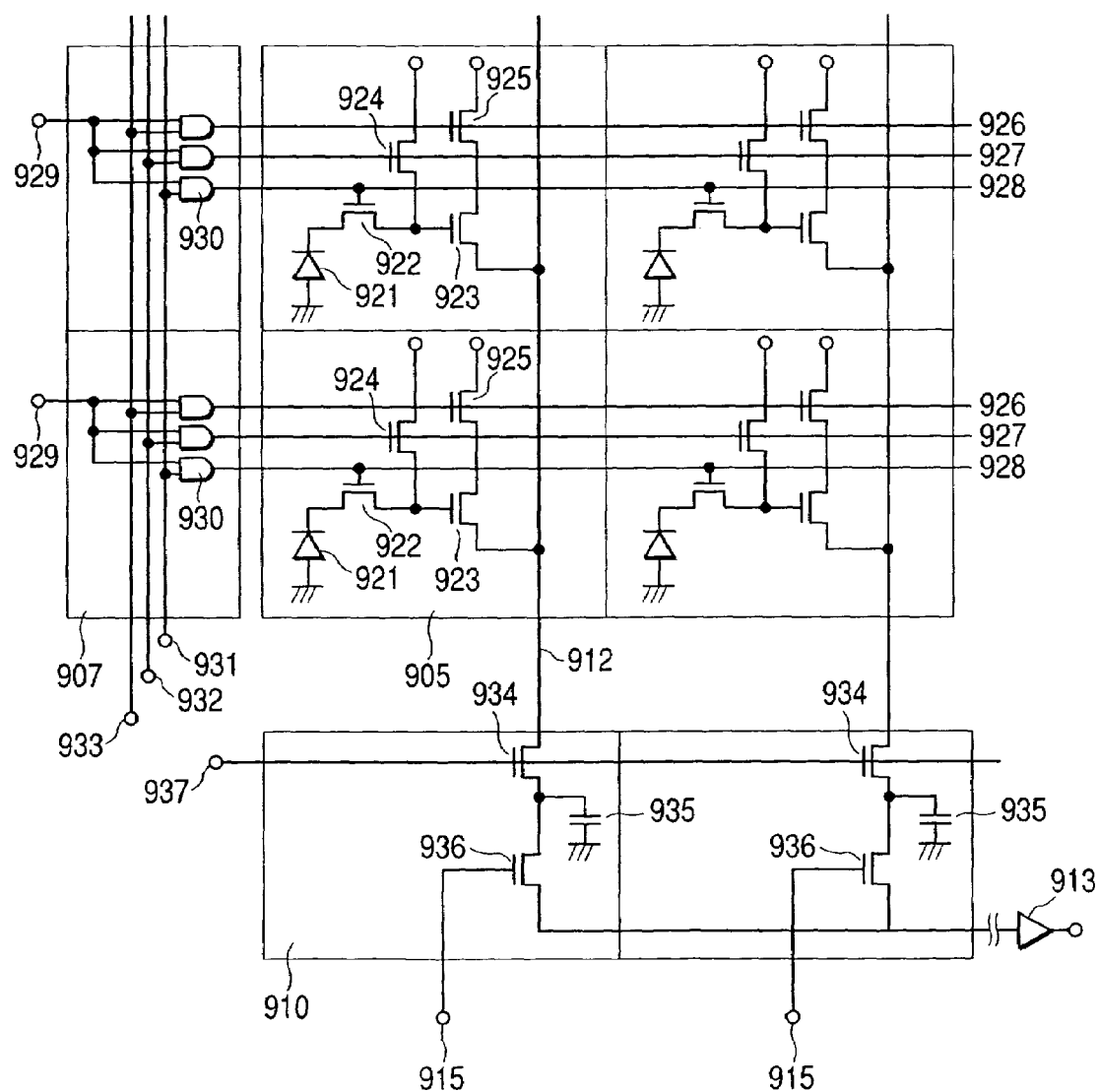
FIG. 5 is a circuit diagram of a pixel, a pulse signal output circuit and a line memory of FIG. 1.

FIG. 5 is a circuit diagram of the pixel 905, the pulse signal output circuit 907 and the line memory 910. In FIG. 5, reference numeral 921 denotes photodiodes for converting light to charges, 922 denotes transfer switches for transferring the charges converted by the photodiodes 921 to floating diffusion areas, 923 denotes MOS transistors for obtaining amplified signals based on the transferred charges, 925 denotes selection switches for selecting the pixel 905 for reading out the amplified signal to the vertical signal line 912, and 924 denotes reset switches for resetting a potential of the floating diffusion areas and the photodiodes 921 after the amplified signal is read out.

In addition, in FIG. 5, reference numerals 926 to 928 denote selection pulse transmitting lines, reset pulse transmitting lines and transfer pulse transmitting lines that transmit selection pulses, reset pulses and transfer pulses for controlling on/off of the selection switches 925, the reset switches 924 and the transfer switches 922, respectively, and 931 to 933 denote a transfer pulse generating signal input terminal, a reset pulse generating signal input terminal and a selection pulse generating signal input terminal for inputting generating signals that generate a transfer pulse, a reset pulse and a selection pulse to be transmitted through the transfer pulse transmitting lines 928, the reset pulse transmitting lines 927 and the selection pulse transmitting lines 926, respectively, 930 denotes AND gates for adding each generating signal to be inputted from the transfer pulse generating signal input terminal 931, the reset pulse generating signal input terminal 932 and the selection pulse generating signal input terminal 933 and a control signal to be outputted from the vertical shift register 906, 934 denotes input control switches for controlling to input of the charges which are read out to the vertical output line 912, to the line memory 910, 937 denotes a control pulse transmitting line for transmitting a control pulse that controls on/off of the input control switches 934, 935 denotes capacitors for accumulating the charges read out to each vertical output line 912, 936 denotes output control switches for controlling output of the charges accumulated in the capacitors 935, and 915 denotes input terminals for inputting a control signal from the horizontal shift register.

Figure 1:
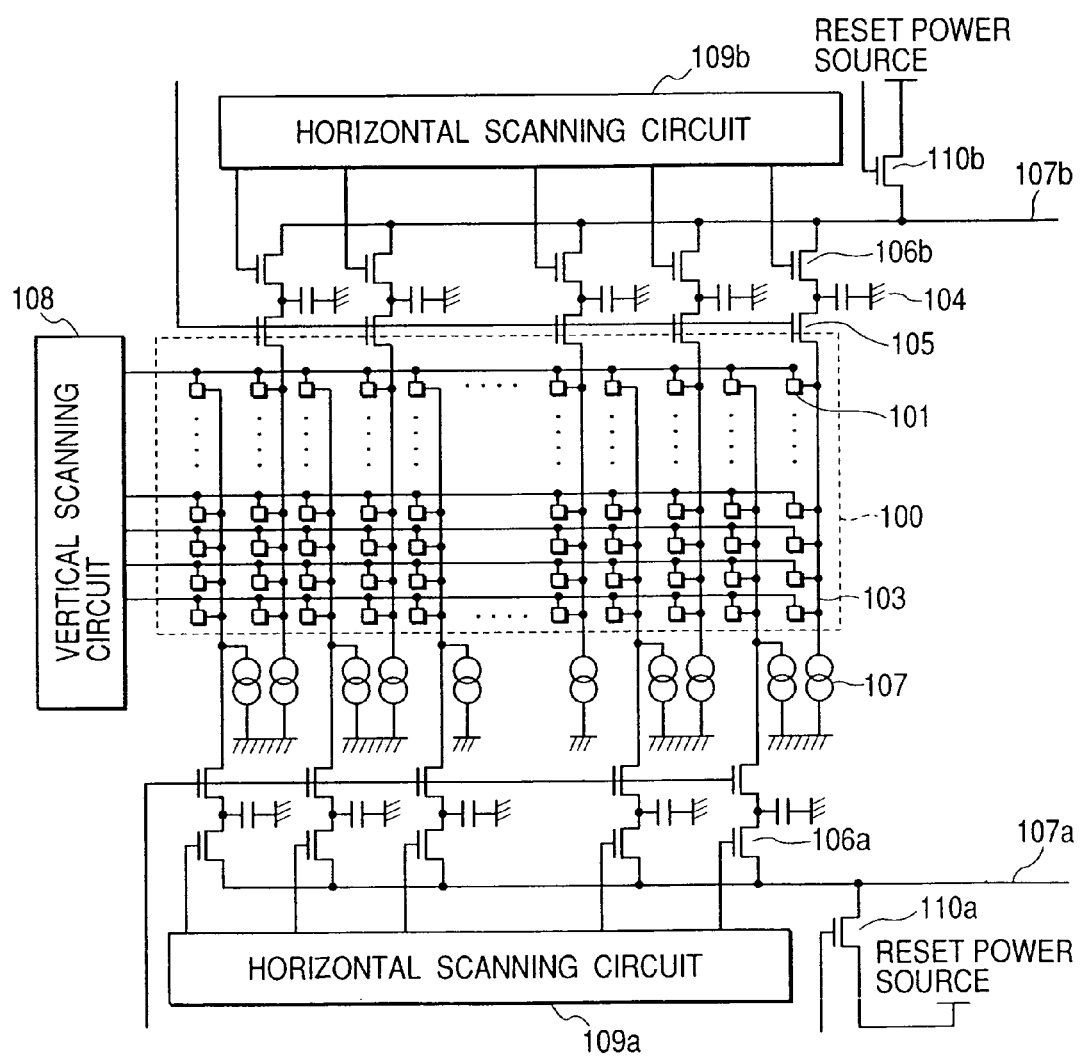
FIG. 1 is a schematic view showing a configuration of a conventional solid-state image pickup element.
Figure 2:
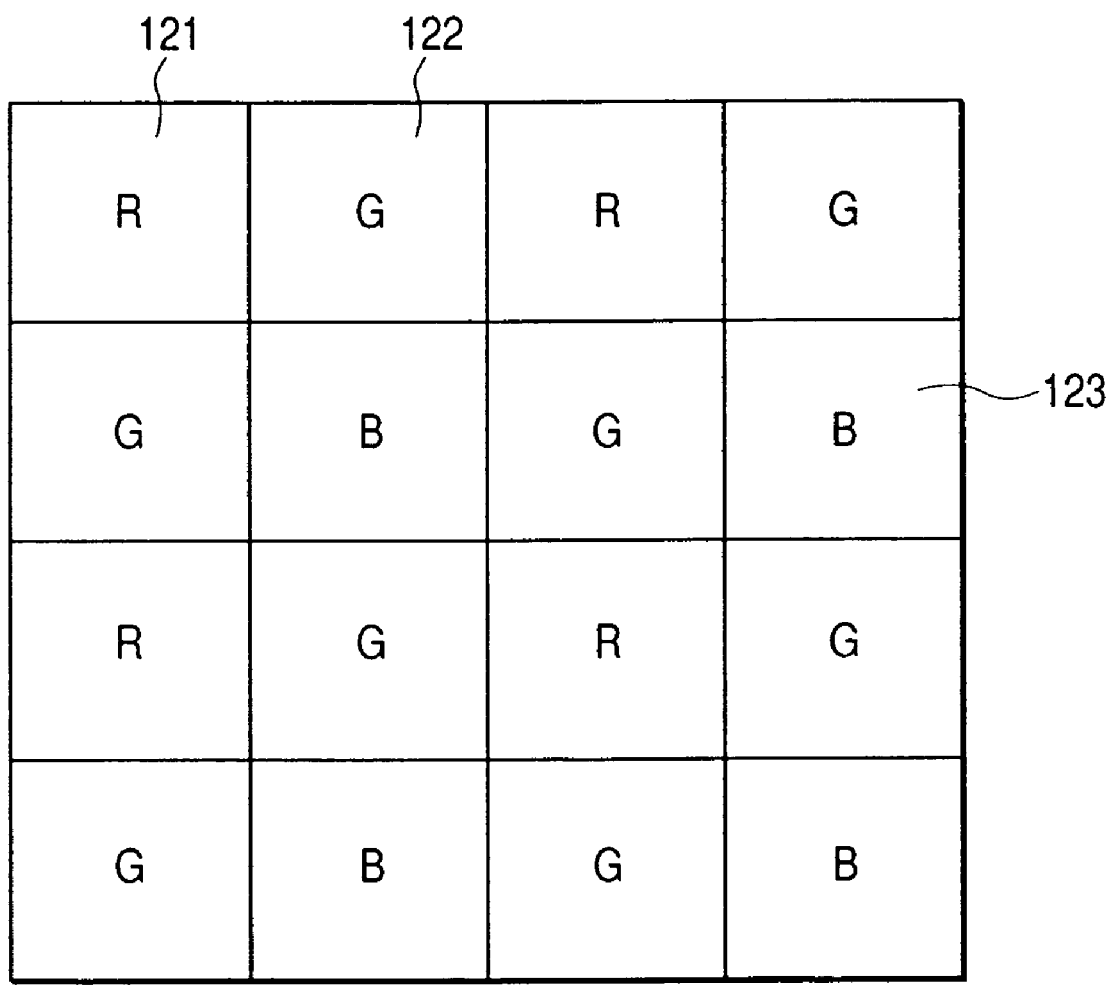
FIG. 2 is a view showing a part of the conventional solid-state image pickup element.

Further, the pixel having a MOS type image pickup element as shown in FIG. 5 has an advantage that it is excellent in an automatic exposure mechanism, can realize low power consumption, can be formed by one chip and can be read out nondestructively. However, for example, an amplified MOS imager (AMI) image pickup element, a charge modulation device (CMD) and a CCD image pickup element can also be used other than the configuration shown in FIG. 2. Note that, for example, when a CCD image pickup element is used, it is sufficient to arrange a vertical transfer CCD and a horizontal transfer CCD instead of the vertical shift registers 906a and 906b and the horizontal shift registers 911a and 911b.

Further, the horizontal signal line 909 is provided with the reset pulse transmitting line 928, the reset pulse transmitting line 927 and the selection pulse transmitting line 926.

Next, operations of FIGS. 4 and 5 will be described. First, light from a subject is condensed on a solid-state image pickup element by an image pickup lens. Then, when the light enters each photo diode 921 arranged in a corresponding position in each of the image pickup areas 901 to 904 of R, G1, G2 and B, charges are generated.

Figure 11:
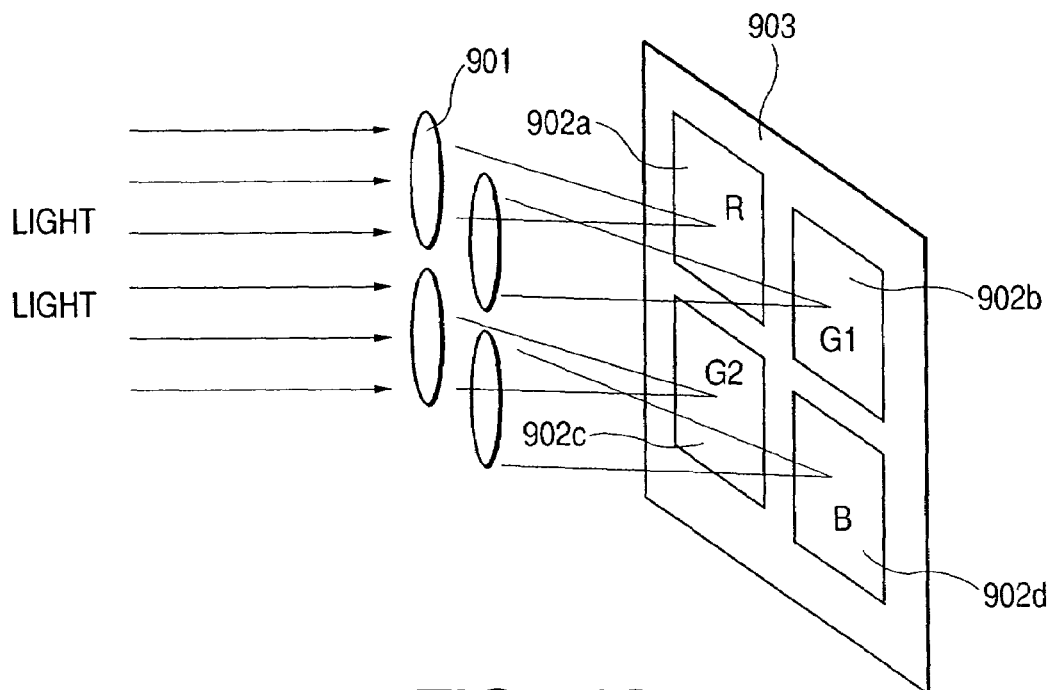
FIG. 11 is a view representing a relation between a solid-state image pickup element and lenses.

In this embodiment, as described with reference to FIG. 11 later, the image of subject is divided into a plurality of images by an image pickup lens provided in association with each of the image pickup areas 901 to 904 and each image is formed on each of the image pickup areas 901 to 904.

Thereafter, when control signals outputted from each vertical shift register 906b in accordance with the clock signal VKLC1, respectively, are inputted in the pulse signal output circuit 907 through each input terminal 929, the pulse signal output circuit 907 generates a transfer pulse signal for turning on each transfer switch 922 based on this control signal and a generated signal which is inputted through the transfer pulse generating signal input terminal 931, by the AND gate 930 and transmits the transfer pulse signal to the pixel 905 side through the transfer pulse transmitting lines 928.

Then, for example, the transfer switch 922 of the pixel 905 in each third row of the G2 image pickup area 903 and the B image pickup area 904 is turned on, and the charges in the photo diode 921 are transferred to the floating diffusion area. Thus, the gate of each MOS transistor 923 is turned on by these charges.

Next, when control signals outputted from each vertical shift register 906b in accordance with the clock signal VKLC1, respectively, are inputted into the pulse signal output circuit 907 through each input terminal 929, the pulse signal output circuit 907 generates a selection pulse signal for turning on the gate of each selection switch 925 of the pixel 905 from which an amplified signal based on the charges is read out, according to this control signal and a generated signal which is inputted through the selection pulse generating signal input terminal 933, by the AND gate 930 and transmits the selection pulse signal through the selection pulse transmitting lines 926.

Here, as a number is given to each pixel 905 in the third row of each of the image pickup areas 901 to 904, the gate of each selection switch 925 of the pixel 905 in the first column of the third row of the G2 image pickup area 903, the pixel 905 in the first column of the third row of the B image pickup area 904, the pixel 905 in the second column of the third row of the G2 image pickup area 903, the pixel 905 of the second column of the third row of the B image pickup area 904, the pixel 905 in the third column of the third row of the G2 image pickup area 903 and the pixel 905 in the third column of the third row of the B image pickup area 904 is turned on.

In this way, the amplified signal obtained by each MOS transistor 923 is read out to each vertical signal line 912. Further, in each pixel 905 from which the amplified signal is read out, each reset switch 924 is turned on by a reset pulse signal which is generated by the AND gate 930 based on the control signals outputted from each vertical shift register 906b, respectively, in accordance with the clock signal VKLC1 and a generation signal to be inputted through the reset pulse generating signal input terminal 932, and potentials of each floating diffusion area and each photo diode 921 is reset.

On the other hand, the amplified signal read out to each vertical signal line 912 is accumulated in each capacitor 935 of the line memory 910 when the input control switch 934 is turned on in response to a signal transmitted through the control pulse transmitting line 937.

Thereafter, control signals for sequentially outputting the amplified signals accumulated in each capacitor 935 to the outside are generated in each of the horizontal shift registers 911a and 911b and outputted to the line memory 910, respectively, in accordance with the clock signals HCLK1 and HCLK2. Here, if high and low of the clock signals HCLK1 and HCLK2 are made to appear alternately, each output control switch 936 is sequentially turned on in the order of reading out the amplified signals of each pixel 905 and the amplified signals accumulated in the line memory 910 are outputted to the outside.

Similarly, the amplified signal is read out from each pixel 905 in the third row of the R image pickup area 901 and the G1 image pickup area 902. Subsequently, the amplified signals from each pixel 905 in the second row of the G2 image pickup area 903 and the B image pickup area 904, each pixel 905 in the second row of the R image pickup area 901 and the G1 image pickup area 902, each pixel 905 in the first row of the G2 image pickup area 903 and the B image pickup area 904 and each pixel 905 in the first row of the R image pickup area 901 and the G1 image pickup area 902 are outputted to the outside, respectively.

As described above, in this embodiment, two vertical shift registers 906a and 906b are provided in the vertical direction, respectively, whereby a time difference caused when outputting a signal read out from the pixel 905 arranged in a position corresponding to each of the image pickup areas 901 to 904 to a processing circuit, is reduced to a time difference equivalent to that in outputting a signal of pixels 905 on one line.

That is, if a signal is outputted from the next image pickup area after a signal from one image pickup area is outputted with respect to the image pickup areas arranged in the vertical direction, a time for accumulating photoecharges varies significantly between the two image pickup areas in the vertical direction, which adversely affects a final image.

For example, if pixels are arranged in m lines in each image pickup area, that is, pixels of 2m lines are arranged for an entire solid-state image pickup element, there is a time difference equivalent to a time difference in outputting control signals for pixels of m lines from the moment when control signals are outputted to pixels in the i-th ($1 \leq i \leq m$) line of the R image pickup area to the moment when control signals are outputted to pixels in the i-th ($1 \leq i \leq m$) of the G2 image pickup area. The difference of time period in accumulation of photoecharges between the two image pickup areas in the vertical direction is nearly eliminated by the operation of this embodiment described above.

In addition, in this embodiment, since signals are alternately outputted for each pixel from different image pickup areas in reading out signals accumulated in the line memory, processing in a processing circuit in a later stage becomes easy.

In addition, in this embodiment, since an amplifier or the like is not provided for each image pickup area but is provided in common for four image pickup areas, for example, dispersion or the like for each amplifier is eliminated and it becomes possible to obtain a satisfactory image.

Figure 6:
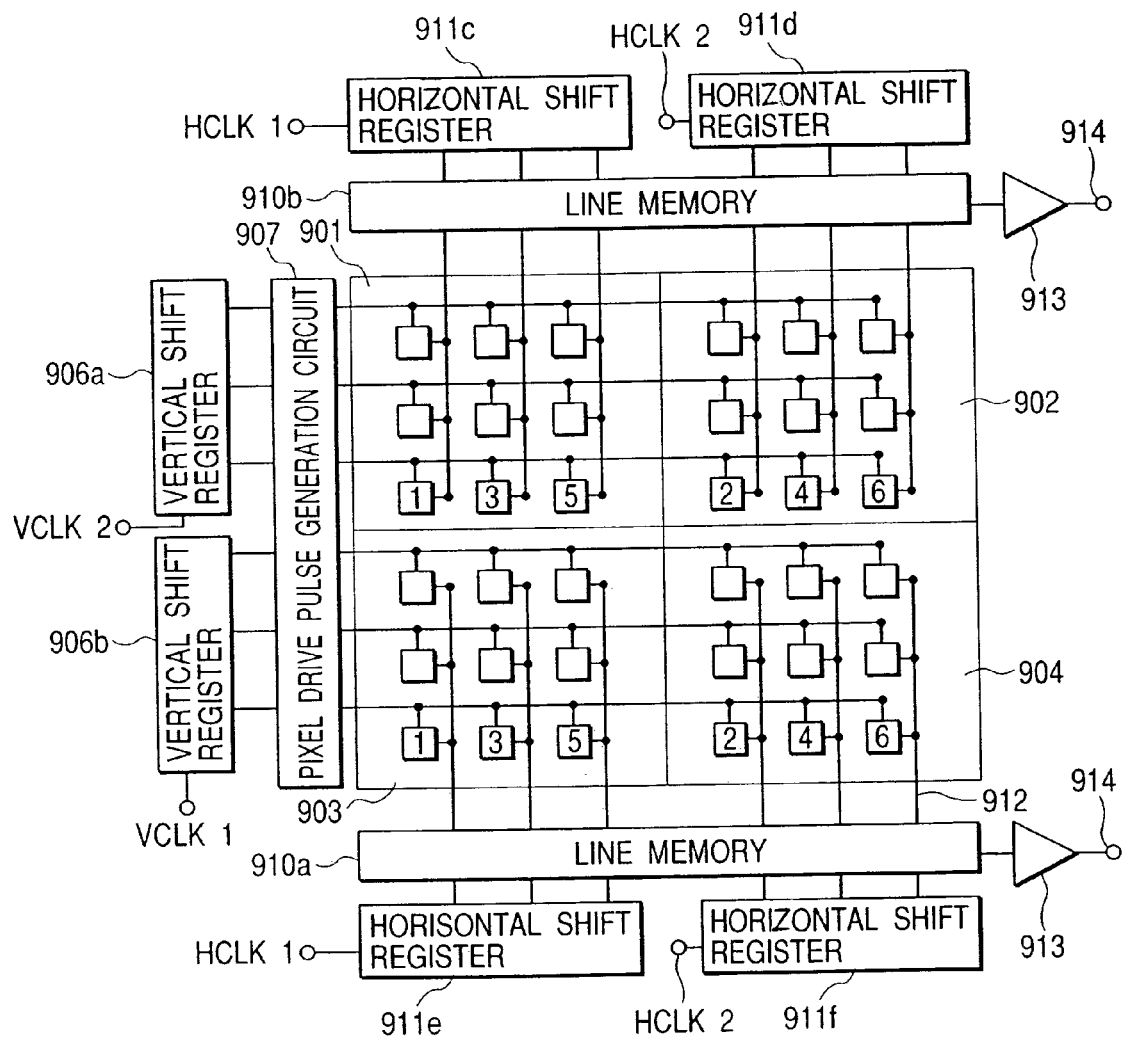
FIG. 6 is a schematic plan view showing a configuration of a solid-state image pickup element in accordance with a second embodiment of the present invention.

FIG. 6 is a schematic view showing a configuration of a solid-state image pickup element of a second embodiment of the present invention, components of which are formed in a same semiconductor chip by the CMOS process or the like. In FIG. 6, reference symbols 910a and 911b denote line memories for accumulating charges or the like read out from the pixels 905 arranged in the R image pickup area 901 and the G1 image pickup area 902, respectively, and 911c to 911f denote horizontal shift registers for sequentially outputting charges or the like read out from the R image pickup area 901, the G1 image pickup area 902, the G2 image pickup area 903 and the B image pickup area 904 among the charges or the like retained in the line memories 910a and 911b to an external processing circuit. Further, in FIG. 6, parts similar to those shown in FIG. 4 are given identical reference numerals.

In addition, operations of the solid-state image pickup element shown in FIG. 6 are similar to those shown in FIG. 4. However, as numbered in FIG. 6, control signals to be generated in the vertical shift registers 906a and 906b are outputted to a processing circuit in the following order when attention is paid to the pixels 905 arranged in the third row of each image pickup areas 901 to 904: for example, amplified signals from the pixels 905 in the first column of the third row of the G2 image pickup area 903 and amplified signals from the pixels 905 in the first column of the third row of the R image pickup area 901 are simultaneously outputted, amplified signals from the pixels 905 in the first column of the third row of the B image pickup area 904 and amplified signals from the pixels 905 in the first column of the third row of the G1 image pickup area 902 are outputted simultaneously next, amplified signals from the pixels 905 in the second column of the third row of the G2 image pickup area 903 and amplified signals from the pixels 905 of the second column of the third row of the R image pickup area 901 are outputted simultaneously next, and amplified signals from the pixels 905 in the second column of the third row of the B image pickup area 904 and amplified signals from the pixels 905 in the second column of the third row of the G1 image pickup area 902 are outputted simultaneously next.

Moreover, amplified signals read out from the pixels 905 arranged in the R image pickup area 901 and accumulated in the line memory 910a are outputted to the processing circuit in response to a control signal generated by the horizontal shift register 911c. Amplified signals read out from the pixels 905 arranged in the G1 image pickup area 902 and accumulated in the line memory 910a are outputted to the processing circuit in response to a control signal generated by the horizontal shift register 911d.

Similarly, amplified signals read out from the pixels 905 arranged in the G2 image pickup area 903 and accumulated in the line memory 901b are outputted to the processing circuit in response to a control signal generated by the horizontal shift register 911e. Amplified signals read out from the pixels 905 arranged in the B image pickup area 904 and accumulated in the line memory 910f are outputted to the processing circuit in response to a control signal generated by the horizontal shift register 911d.

As described above, in this embodiment, two vertical shift registers 906a and 906b are provided in the vertical direction, respectively, whereby a time difference caused when outputting a signal read out from the pixel 905 arranged in a position corresponding to each of the image pickup areas 901 to 904 to a processing circuit is eliminated.

That is, if a signal is outputted from the next image pickup area after a signal from one image pickup area is outputted with respect to the image pickup areas arranged in the vertical direction, a time for accumulating photoecharges varies significantly between the two image pickup areas in the vertical direction, which adversely affects a final image.

For example, if pixels are arranged in m lines in each image pickup area, that is, pixels of 2m lines are arranged for an entire solid-state image pickup element, there is a time difference equivalent to a time difference in outputting control signals for pixels of m lines from the time when control signals are outputted to pixels in the i-th ($1 \leq i \leq m$) line of the R image pickup area until the time when control signals are outputted to pixels in the i-th ($1 \leq i \leq m$) of the G2 image pickup area. The difference of time period in accumulating photocharges between the two image pickup areas in the vertical direction is completely eliminated by this embodiment.

In addition, in this embodiment, since signals are alternately outputted for each pixel from different image pickup areas in reading out signals accumulated in the line memory, processing in a processing circuit in a later stage becomes easy. In the above-mentioned embodiments, a difference of time period in accumulating photocharges in the same line between image pickup areas is reduced and a satisfactory image can be obtained. In addition, since a plurality of image pickup areas are arranged two-dimensionally, it becomes possible to make a chip size compact and at the same time to reduce deviation of images if an image of a subject is divided into a plurality of image pickup areas and an image is formed on each image pickup area.

Figure 7:
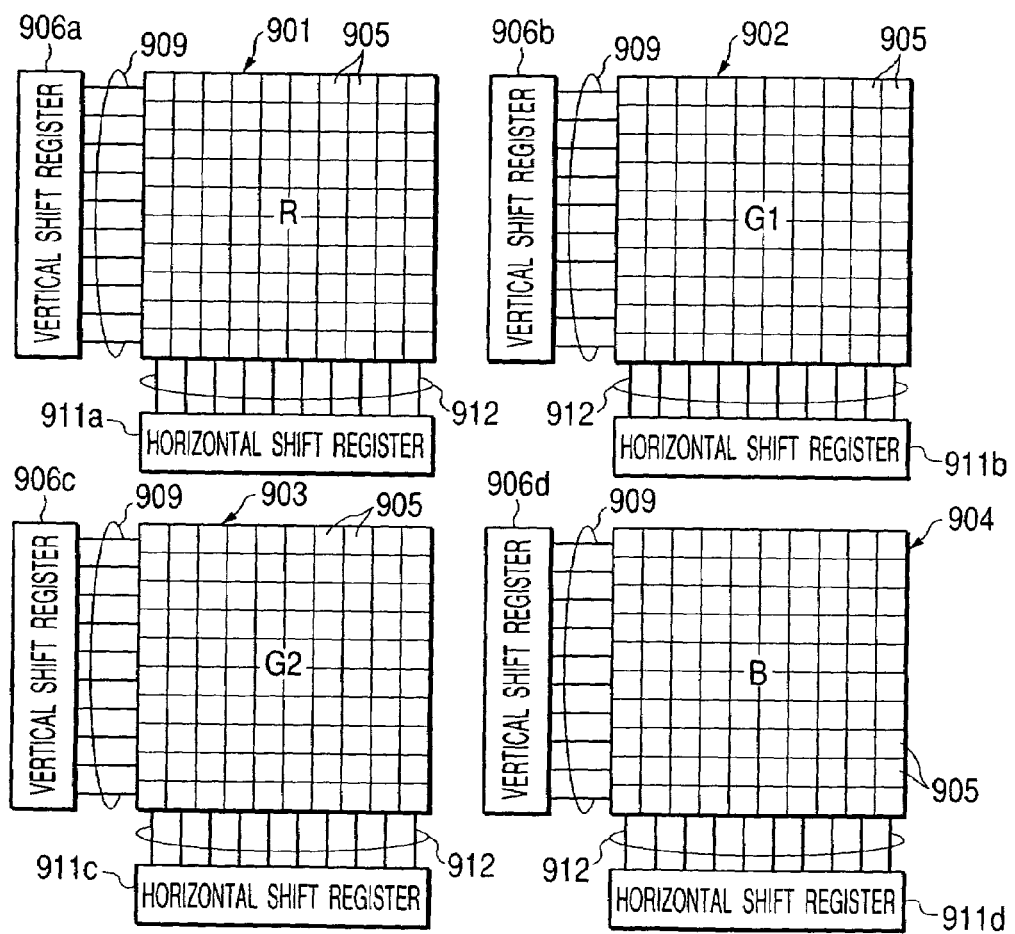
FIG. 7 is a schematic view showing a configuration of a solid-state image pickup element in accordance with a third embodiment of the present invention.

FIG. 7 is a schematic view showing a configuration of a solid-state image pickup element of a third embodiment of the present invention. In FIG. 7, reference numeral 905 denotes pixels having photoelectric conversion element, and 901 to 904 denote image pickup areas of R, G1, G2 and B in which the pixels 905 are arranged two-dimensionally to form an image, respectively, the four image pickup areas being configured to be arranged two-dimensionally. Reference symbols 906a to 906d denote vertical shift registers for controlling timing for supplying a control signal for reading out an amplified signal that is based on a charge from each pixel 905 arranged in each of the image pickup areas 901 to 904, respectively, 909 denotes horizontal signal lines for supplying a control signal to each pixel 905, 912 denotes vertical signal lines for transmitting an amplified signal read out from each pixel 905, and 911a to 911d denote horizontal shift registers for sequentially controlling the transfer of amplified signals read out to the vertical signal lines 912 to an external processing circuit, respectively.

Further, the image pickup areas 901 to 904 of R, G1, B and G2 are configured in terms of optical design such that, for example, the R image pickup area 901 provided with an R filter and the B image pickup area 904 provided with a B filter are arranged orthogonally, and the G1 image pickup area 902 provided with a G1 filter and the G2 image pickup area 903 provided with a G2 filter are arranged orthogonally. Here, a specific configuration of each pixel 905 is identical with the pixel 905 in FIG. 5.

Next, operations of FIG. 7 will be described. First, an image of a subject is divided into four images by image pickup lenses, which are provided in association with each of the image pickup areas 901 to 904, respectively, and the images are focused on each of the image pickup areas 901 to 904. Then, when light enters each photo diode 921 arranged in a corresponding position in each of the image pickup areas 901 to 904 of R, G1, G2 and B, charges are generated. Thereafter, when each transfer switch 922 is turned on, the charges in each photo diode 921 are transferred to each floating diffusion area. Thus, the gate of each MOS transistor 923 is turned on by these charges.

Next, when control signals from the vertical shift registers 906a to 906d turn on the gate of the selection switch 925 that is selected to read out an amplified signal through each horizontal signal line 909, an amplified signal obtained by the MOS transistor 923 is read out to each vertical signal line 912. Further, in each pixel 905 from which an amplified signal is read out, each reset switch 924 is turned on and potentials of each floating diffusion area and each photo diode 921 are reset.

As shown in FIG. 7, the solid-state image pickup element of this embodiment is provided with the vertical shift registers 906a to 906d and the horizontal shift registers 911a to 911d, respectively, for each of the image pickup areas 901 to 904, supplies a control signal simultaneously to each pixel 905 in a corresponding position from each of the vertical shift registers 906a to 906d and further transfers an amplified signal read out from each pixel 905 to a processing circuit by the horizontal shift registers 911a to 911d.

In particular, as shown in FIG. 7, for example, when the vertical shift registers 906a to 906d are arranged on the left and the horizontal shift registers 911a to 911d are arranged below each of the image pickup areas 901 to 904, distances between respective pixels 905 in a corresponding position of each of the image pickup areas 901 to 904 and the vertical shift registers 906a to 906b are equal. Thus, a level of a control signal transmitted through the horizontal signal line 909 is not susceptible to an effect caused by a voltage drop.

Figure 8:
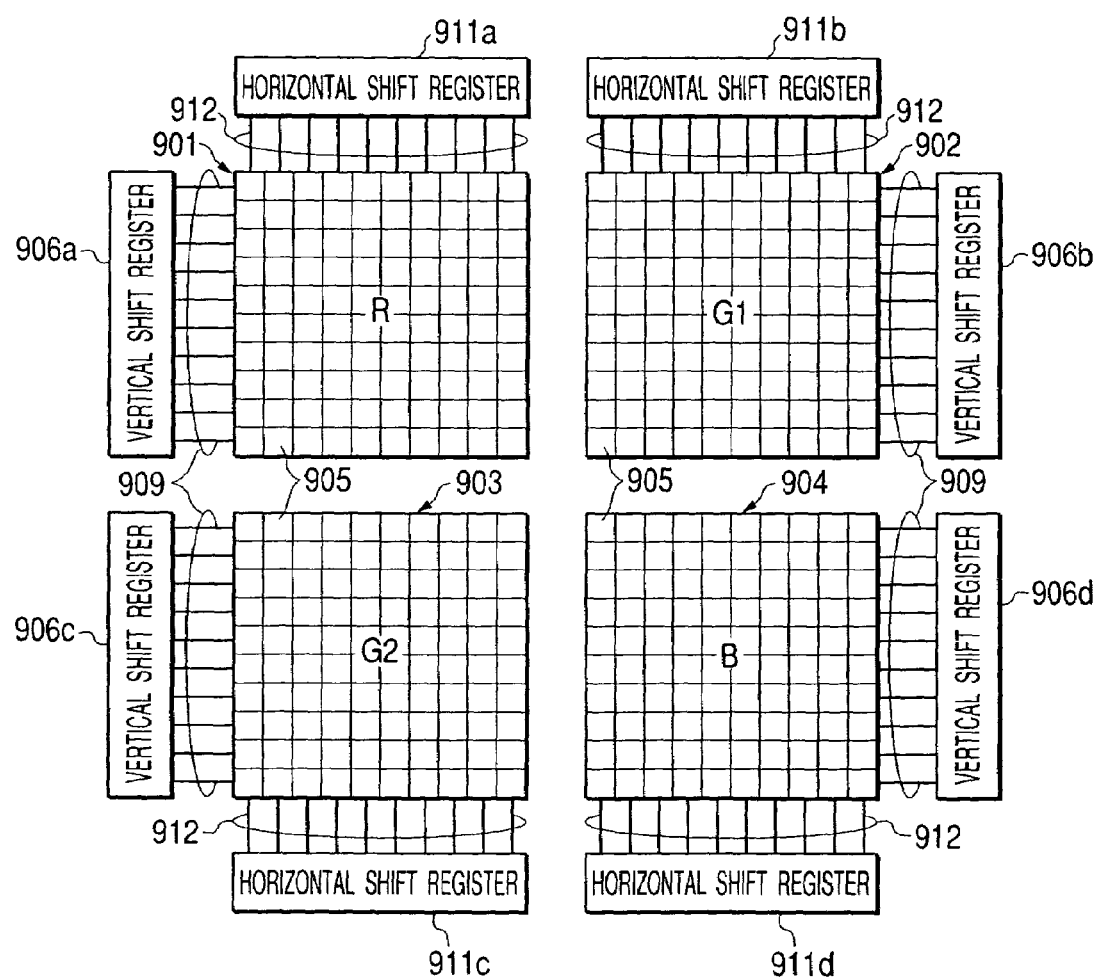
FIG. 8 is a schematic view showing a configuration of a solid-state image pickup element in accordance with a fourth embodiment of the present invention.

FIG. 8 is a schematic view showing a configuration of a solid-state image pickup element of a fourth embodiment of the present invention. In FIG. 8, the vertical shift registers 906a to 906d and the horizontal shift registers 911a to 911d are arranged to surround each of the image pickup areas 901 to 904, respectively. Further, in FIG. 8, parts similar to those in FIG. 7 are given the identical reference symbols.

Note that, it is preferable that an image pickup lens is provided for each image pickup area such that light incident into each of the image pickup areas 901 to 904 forms an image on the pixel 905 positioned at the center of each of the image pickup areas 901 to 904. It is also preferable that such each pixel 905 is close to a point of intersection of a line connecting the pixel 905 positioned in the center of the R image pickup area 901 with the pixel 905 positioned in the center of the B image pickup area 904 and a line connecting the pixel 905 positioned in the center of the G1 image pickup area 902 with the pixel 905 positioned in the center of the G2 image pickup area 903.

In other words, it is preferable that the image pickup areas 901 to 904 are arranged to be close to each other. This is because, for example, if a distance from a subject to each of the image pickup areas 901 to 904 becomes short, since an image to be obtained is different based on charges from each of the image pickup areas 901 to 904, an image is not finally obtained unless complicated supplementation or the like is performed.

Thus, as shown in FIG. 8, the vertical shift registers 906a to 906d and the horizontal shift registers 911a to 911d are arranged to surround each of the image pickup areas 901 to 904, respectively, whereby each of the image pickup areas 901 to 904 are close to each other.

Figure 9:
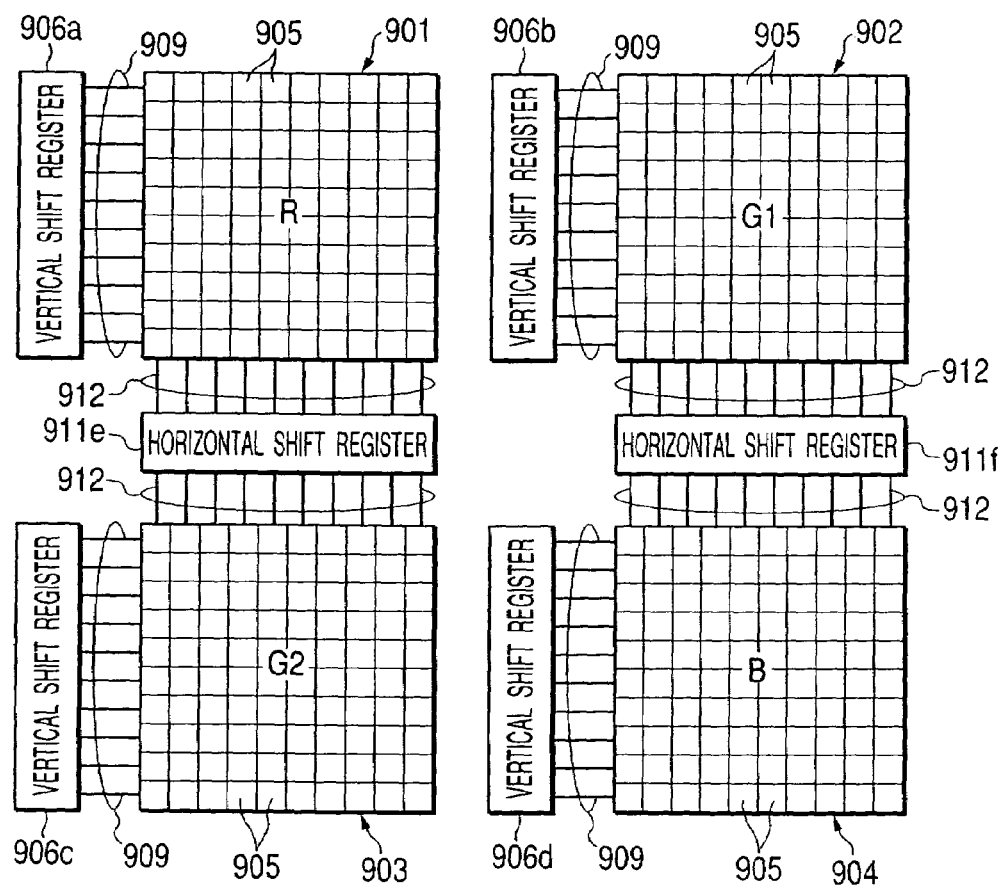
FIG. 9 is a schematic view showing a configuration of a solid-state image pickup element in accordance with a fifth embodiment of the present invention.

FIG. 9 is a schematic view showing a configuration of a solid-state image pickup element of a fifth embodiment of the present invention. In FIG. 9, reference symbols 911e and 911f denote horizontal shift registers that are provided in common with respect to each pixel 905 of the R image pickup area 901 and the G2 image pickup area 903 and each pixel 905 of the G1 image pickup area 902 and the B image pickup area 904, respectively. Further, in FIG. 9, parts similar to those in FIG. 7 are given the identical reference numerals.

Note that, as described above, although it is preferable that the image pickup areas 901 to 904 are provided to be close to each other, the image pickup areas 901 to 904 need to be always spaced apart from each other. This is because a diameter of an image pickup lens to be provided above each of the image pickup areas 901 to 904 needs to be made longer than a length of one side of each of the image pickup areas 901 to 904 in order to cause light from a subject to enter the image pick up areas 901 to 904.

Thus, as shown in FIG. 9, in this embodiment, the horizontal shift registers 911e and 911f are provided in common with respect to each pixel 905 of the R image pickup area 901 and the G2 image pickup area, respectively, and space formed between the R image pickup area 901 and the G2 image pickup area 903 and space formed between the G1 image pickup area 902 and the B image pickup area 904 are effectively utilized. As a result, the solid-state image pickup element is miniaturized.

Further, this embodiment is described with reference to the case in which the horizontal shift registers 911e and 911f are provided in common with respect to each pixel 905 of the R image pickup area 901 and the G2 image pickup area 903, respectively, as an example. However, vertical shift registers may be provided in common with respect to each pixel 905 of the R image pickup area 901 and the G1 image pickup area 902 and each pixel 905 of the G2 image pickup area 903 and the B image pickup area 904, respectively, or the vertical shift registers 906b and 906d may be arranged on the right sides of the G1 image pickup area 902 and the B image pickup area 904.

Figure 10:
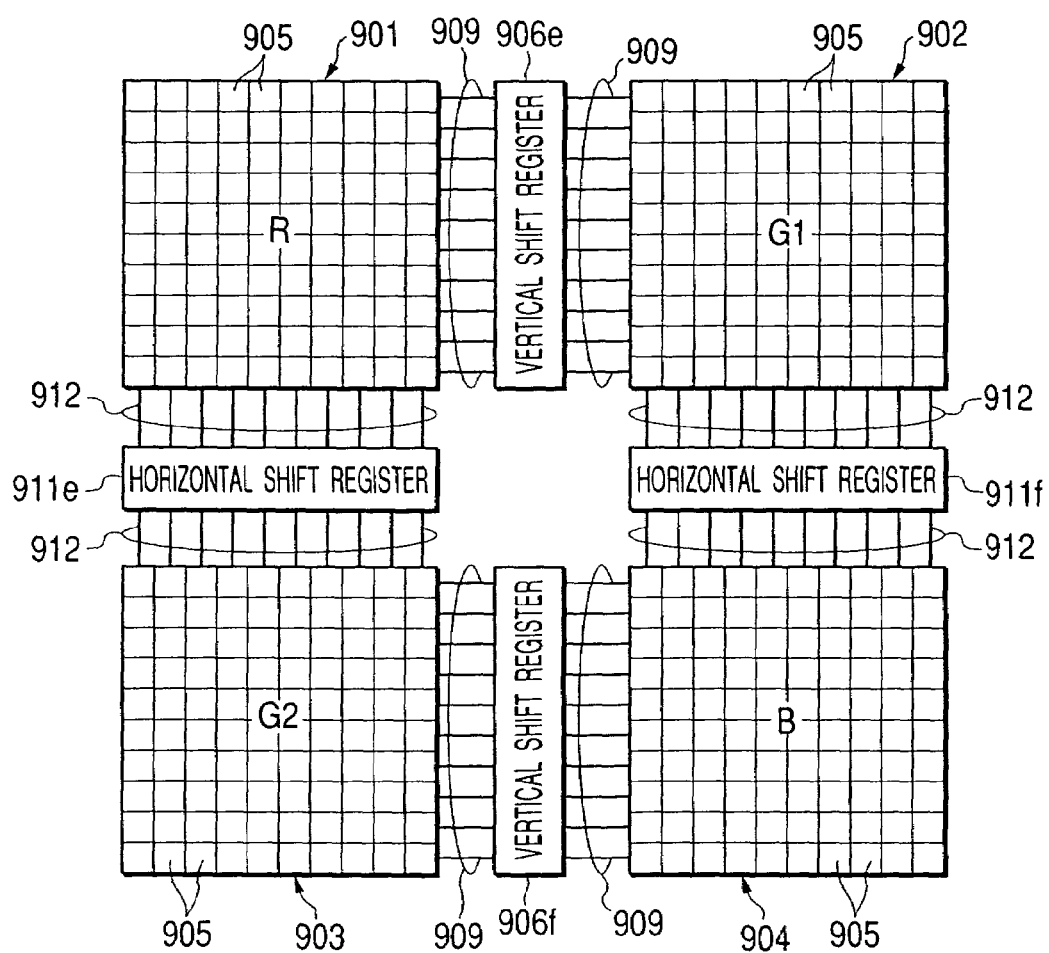
FIG. 10 is a schematic view showing a configuration of a solid-state image pickup element in accordance with a sixth embodiment of the present invention.

FIG. 10 is a schematic view showing a configuration of a solid-state image pickup element of a sixth embodiment of the present invention. Reference symbols 906e and 906f denote vertical shift registers that are provided in common with respect to each pixel 905 of the R image pickup area 901 and the G1 image pickup area 902 and each pixel 905 of the G1 image pickup area 903 and the B image pickup area 904, respectively. Further, in FIG. 10, parts similar to those in FIG. 9 are given identical reference numerals.

In this way, in this embodiment, the vertical shift registers 906e and 906f and the horizontal shift registers 911e and 911f are arranged among the image pickup areas 901 to 904, and spaces formed among the image pickup areas 901 to 904 are effectively utilized, whereby the solid-state image pickup element is miniaturized.

In the above-described third to sixth embodiments, operations for reading out a signal from each image pickup area are the same as those described in the previous embodiments. In addition, although omitted in FIGS. 7 to 10, the line memory denoted as 910 in FIG. 5 is practically arranged between each of the horizontal shift register 911 and each of the image pickup areas 901, 902, 903 and 904.

As described above, when the solid-state image pickup element described in each embodiment of the present invention is used in a digital camera or the like, it becomes possible to make it compact and crosstalk is reduced. Therefore, a high quality image can be obtained.

In addition, in each embodiment, a plurality of image pickup areas, vertical shift registers and horizontal shift registers, which are arranged two-dimensionally, are formed on a same semiconductor chip by the CMOS process or the like.

In addition, although a color filter arrangement of a primary color Bayer is described in each embodiment, other arrangements, for example, a complementary color filter arrangement may be used.

The above-described third to sixth embodiments have the following effects in addition to the effects of the first and the second embodiments.

A solid-state image pickup element is configured so as to have a signal supplying means for supplying signals to pixels in an image pickup area on at least one side in a periphery of each of a plurality of image pickup areas, whereby shading or color heterogeneity in an image can be eliminated.

Moreover, in addition to the above-mentioned configuration, at least one vertical shift register is independently provided in each of a plurality of image pickup areas, whereby a remarkable effect is realized in that high speed driving becomes possible, for example, a problem of not being able to follow up an image pickup operation when picking up a moving image is eliminated.

Matters common to seventh to tenth embodiments will be hereinafter described.

In an image pickup apparatus such as a digital camera in which an image formation lens is arranged on a solid-state image pickup element to focus light from a subject by the image formation lens and convert the light to an electric signal by the solid-state image pickup element, positioning of an image formation center of the image formation lens and a center of a pixel area of the solid-state image pickup element has been performed.

However, the above-mentioned positioning of the image formation center of the image formation lens in the image pickup apparatus and the center of the pixel area of the solid-state image pickup element is not always easy work, and in the case in which high accuracy positioning is structurally required, more complicated work is required.

A characteristic of the seventh to the tenth embodiments described below is that it is made possible to highly accurately and efficiently adjust the center of the pixel area of the solid-state image pickup element and the center of the image pickup lens upon assembling the solid-state image pickup element and the image pickup lens.

The inventor of the present invention examined a compound-eye type solid-state image pickup apparatus that is provided with a plurality of image pickup lenses, focuses light from an image pickup object by each image pickup lens onto a two-dimensional sensor having photoelectric conversion elements and processes an output signal from the two-dimensional sensor in an image processing unit to form an image.

FIG. 10 is a schematic view showing a configuration of an example of the above-mentioned image pickup apparatus. In FIG. 10, reference numeral 901 denotes image pickup lenses for focusing light from an image pickup object onto pixel groups 902a to 902d provided with each color filter of R, G1, G2 and B, and 903 denotes a solid-state image pickup element provided with a plurality of photoelectric conversion elements. Compound-eye image pickup can be performed by providing each filter of R, G1, G2 and B therewith.

The scope of the present invention is not specifically limited to the above-mentioned image pickup apparatus. However, in the compound-eye type image pickup apparatus, fine tuning for aligning the center of each image pickup area of R, G1, G2 and B and the image formation center by image pickup lenses is more difficult compared with a single-eye image pickup apparatus upon assembling the compound-eye type solid-state image pickup element and a plurality of image pickup lenses for focusing light from the image pickup object onto the solid-state image pickup elements. As a result, efficiency of assembly may be lowered. Thus, since an adjustment method other than an optical path adjustment can be provided by configuration of the seventh to the tenth embodiments to be hereinafter described, the configuration can be preferably applied to the case of compound-eye type.

Figure 12:
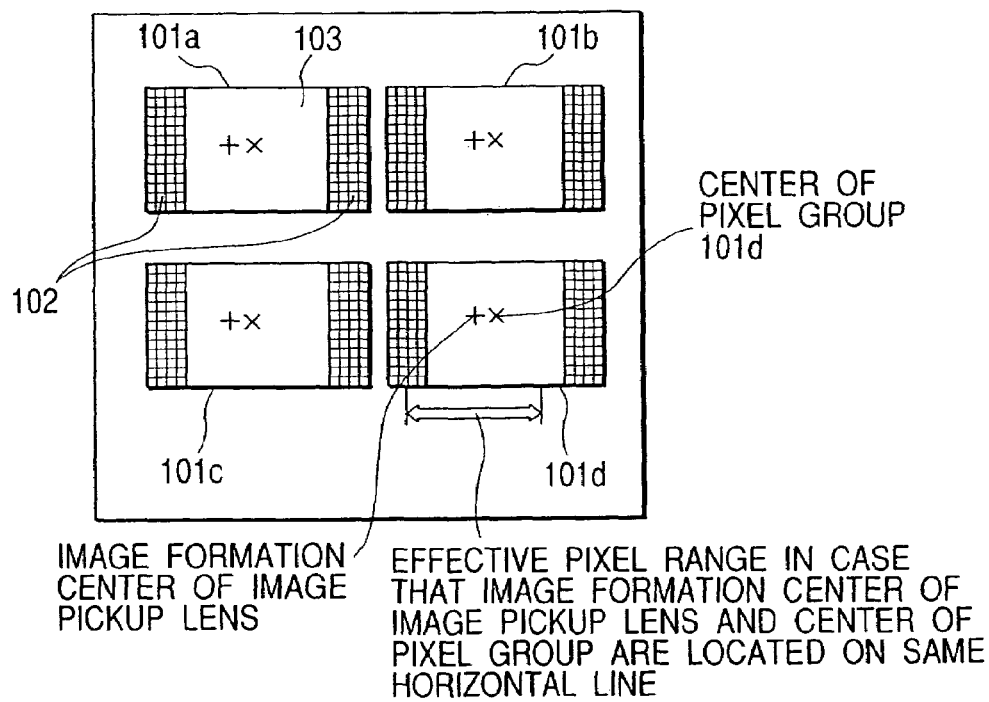
FIG. 12 is a schematic plan view showing a solid-state image pickup element in accordance with a seventh embodiment of the present invention.
Figure 13:
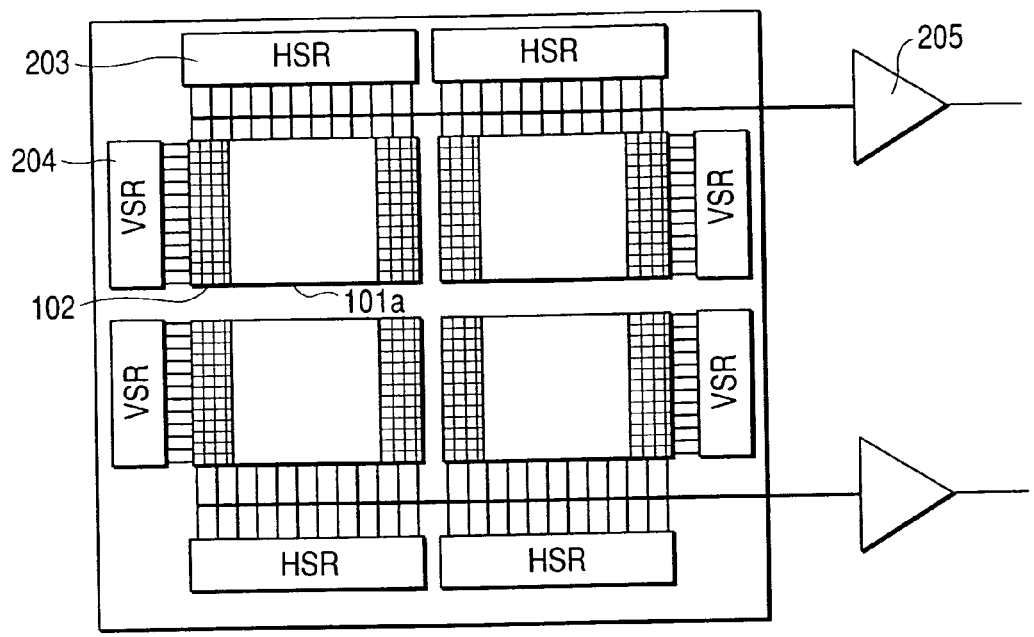
FIG. 13 is a schematic plan view showing the solid-state image pickup element in accordance with the seventh embodiment of the present invention.

FIGS. 12 and 13 are schematic views showing a configuration of a solid-state image pickup element of a seventh embodiment of the present invention. FIG. 12 is a plan view of the solid-state image pickup element of this embodiment, which shows so-called four-eye type. As shown in FIG. 11, the solid-state image pickup apparatus is configured with the image pickup lenses (image formation optical system) arranged in front of the solid-state image pickup element.

In FIG. 12, reference numerals 101 and 102 denote image pickup areas in which photoelectric conversion elements for converting incident light to an electric signal are arranged two-dimensionally. More specifically, reference symbols 101a to 101d denote pixel groups, 102 denotes pixel groups (which will be redundant pixel groups) provided in the line direction for adjusting a position of the center of the pixel groups of the solid-state image pickup element, and 103 denotes one pixel forming the pixel groups 101a to 101d. In the figure, "+" shows an image formation center of each image pickup lens and "x" shows the center of each pixel group.

Figure 3:
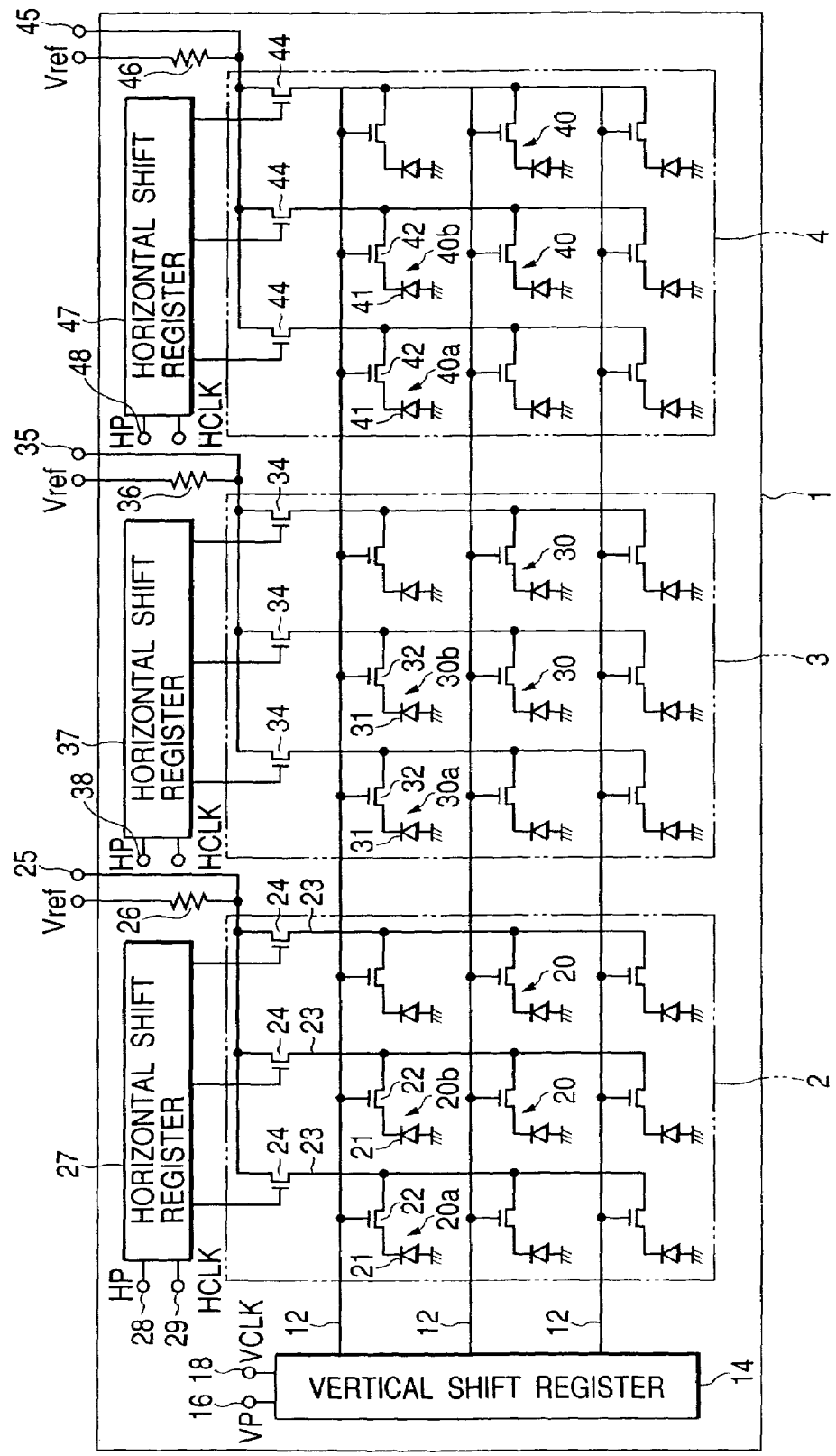
FIG. 3 is a schematic view showing a configuration of the conventional solid-state image pickup element.

FIG. 13 is a plan view showing the case in which the solid-state image pickup elements of FIG. 12 have reading out circuits. In FIG. 13, reference symbols 101a to 101d denote pixel groups (in the figure, reference symbols 101b to 101d are omitted), 102 denotes pixel groups provided in the line direction for adjusting a position of the center of the pixel groups of the solid-state image pickup element, 203 denotes horizontal shift registers (HSRs) for reading out outputs from the pixel groups, 204 denotes vertical shift registers (VSRs) for reading out outputs from the pixel groups, and 205 denotes amplifiers for amplifying the outputs read out from the pixel groups. The pixel groups 101a to 101d and 102 are configured from the pixels as shown in FIG. 3.

Figure 14:
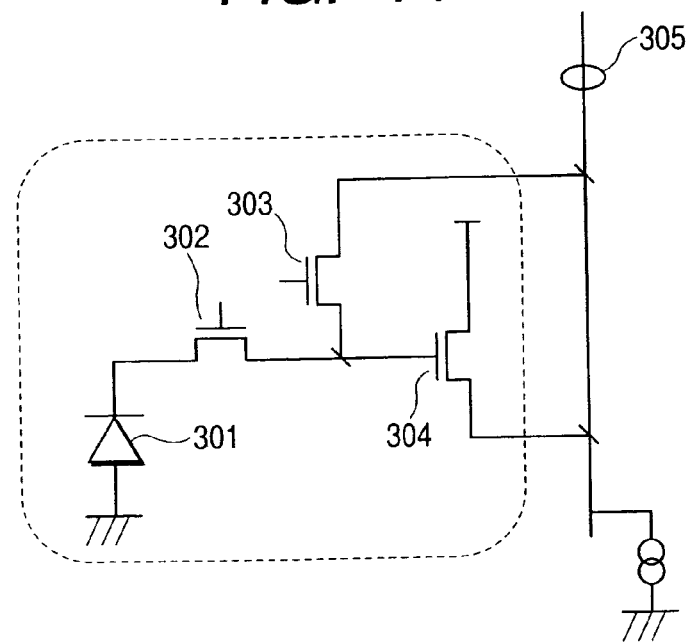
FIG. 14 is a schematic plan view showing a configuration of a pixel to be used in the seventh to the ninth embodiments of the present invention.

FIG. 14 is an equivalent circuit diagram showing a configuration of the pixel 103. Reference numeral 301 denotes a photo diode for photoelectrically converting incident light, 302 denotes a transfer switch for transferring an electric signal to a floating diffusion (FD) area, 303 denotes a reset switch for resetting charges of the floating diffusion (FD) area, 304 denotes a MOS transistor for obtaining an amplified signal, where the floating diffusion (FD) area and the gate are connected to each other, and 305 denotes a vertical output line for outputting signal charges.

An electric signal is transferred from the photo diode 301 to the floating diffusion area by the vertical shift registers (VSRs) 204 shown in FIG. 13 and amplified by the MOS transistor 304, and then the electric signal is outputted to the vertical output line 305. The signal is read out from the vertical output line 305 to the amplifiers 205 by the horizontal shift registers (HSRs) 203 of FIG. 2 and amplified.

The image pickup apparatus of this embodiment has the four pixel groups 101a to 101d provided with four filters of R, G1, G2 and B and causes incident light to enter the pixel 103 forming each pixel group 101a to 101d through image pickup lenses.

When assembling the solid-state image pickup element as shown in FIG. 12 and image pickup lenses, in order to align the center of each pixel group and the center of each image pickup lens, an effective pixel range is set from the pixel group 101a and the pixel group 102 provided in this embodiment, whereby it becomes possible to easily align the center of each pixel group and the center of each image pickup lense and efficiency in the assembly can be increased. This is effective for assembly with large deviation in the horizontal direction in this embodiment. In addition, the pixels that are not used as effective pixels among the pixels of the pixel group 102 also photoelectrically convert incident light to output electric signals. The optical output signals are read out by the vertical shift registers 204 and the horizontal shift registers 203, amplified by the amplifiers 205 and outputted to a signal processing unit for forming an image. However, it is sufficient to idly read the signals from the pixels not used as image information and not to take them in as image information.

Then, signals from the pixels used as image information is subjected to various processing such as color processing and processed signals are outputted to a display (displaying means), a memory or the like.

In addition, any sensor such as an amplified MOS imager (AMI), a charge modulation device (CMD) and a CCD may be used other than a so-called CMOS sensor shown in FIG. 14.

This embodiment is appropriately used in the case in which alignment of a center of pixel groups of a solid-state image pickup element and an image forming center of image pickup lenses in the line direction is difficult. For example, as shown in FIG. 20, if a width of a selection oxide film area 110 dividing the pixel group is larger in the column direction than in the row direction, that is, if a width of a selection oxide film area divining the R pixel group and the G2 pixel group as well as the G1 pixel group and the B pixel group is made larger than a width of a selection oxide film area dividing the R pixel group and the G1 pixel group as well as the G2 pixel group and the B pixel group, the arrangement of the pixel groups and the image pickup lenses is as shown in FIGS. 12 and 13.

Figure 20:
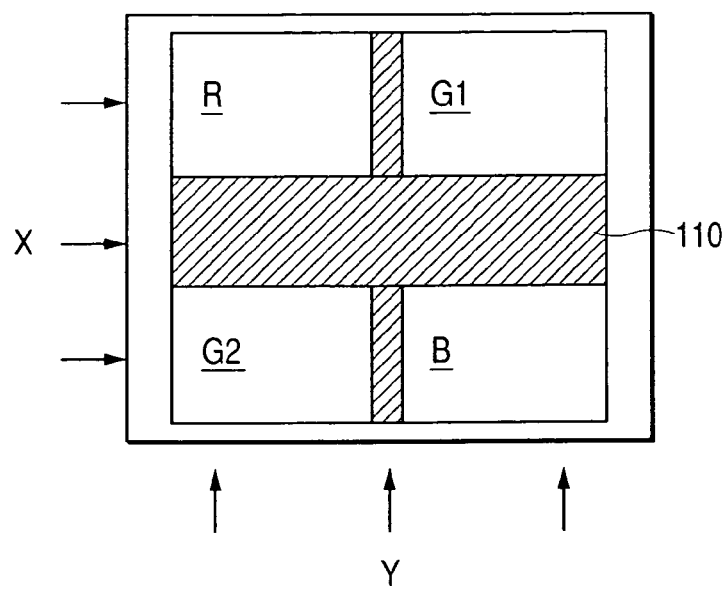
FIG. 20 is a plan view showing a configuration of a solid-state image pickup element.
Figure 21:
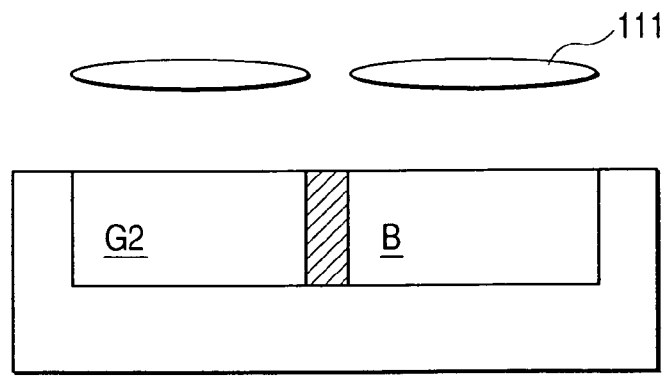
FIG. 21 is a sectional view showing an arrangement of a pixel group of a solid-state image pickup element and image pickup lenses.
Figure 22:
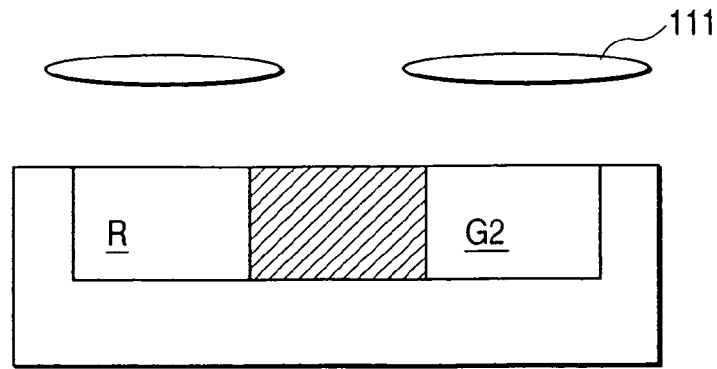
FIG. 22 is a sectional view showing an arrangement of a pixel group of a solid-state image pickup element and image pickup lenses.

When a positional relation between the image forming lenses and the pixel groups of the solid-state image pickup element is viewed from the Y direction of FIG. 20, the distance between the image pickup lenses is shortened because the width of the selection oxide film is small as shown in FIG. 21. Here, for example, if an image is formed on the B pixel group adjacent the G2 pixel group by the image pickup lense 111 that originally plays the role of forming an image on the G2 pixel group, a phenomenon called smear is caused. Therefore, in the horizontal direction (row direction) in which the width of the selection oxide film dividing the R pixel group and the G1 pixel group as well as the G2 pixel group and the B pixel group is small, it is necessary to highly accurately adjust positions of the optical center by the image pickup lense 111 and the center of each pixel group. On the other hand, when the positional relation between the image pickup lenses and the pixel groups of the solid-state image pickup element is viewed from the X direction of FIG. 20, the distance between the image pickup lenses becomes large because the width of the selection oxide film is large as shown in FIG. 22. In this case, light that should form an image on a certain pixel group is less likely to form an image on an adjacent pixel group thereto. Therefore, accuracy of a positional adjustment of the optical center by the image pickup lenses and the center of each pixel group may be lower in the vertical direction (column direction) in which the width of the selection oxide film dividing the R pixel group and the G2 pixel group as well as the G1 pixel group and the B pixel group than in the horizontal direction (row direction).

Thus, in the configuration shown in FIG. 20, since alignment of the center of the pixel groups of the solid-state image pickup element and the image formation center of the image pickup lenses is difficult in the horizontal direction (row direction) of the pixel groups, and it is desirable to provide the redundant pixel groups 102 shown in FIG. 12 in the horizontal direction.

Further, a circuit (analog/logic), a GND or the like may be provided in a LOCOS area in the vertical and the horizontal directions.

In addition, in some cases, the selection oxide film dividing the R pixel group and the G1 pixel group as well as the G2 pixel group and the B pixel group is not formed and the R pixel group and the G1 pixel group as well as the G2 pixel group and the B pixel group are formed adjacent to each other.

In an eighth embodiment to be described later, an example in which a redundant pixel group is provided in the column direction will be described. This is also preferably used in the case in which alignment of a center of pixel groups of a solid-state image pickup element and an image formation center of image pickup lenses is difficult in the column direction (vertical direction) of the pixel groups.

Figure 15:
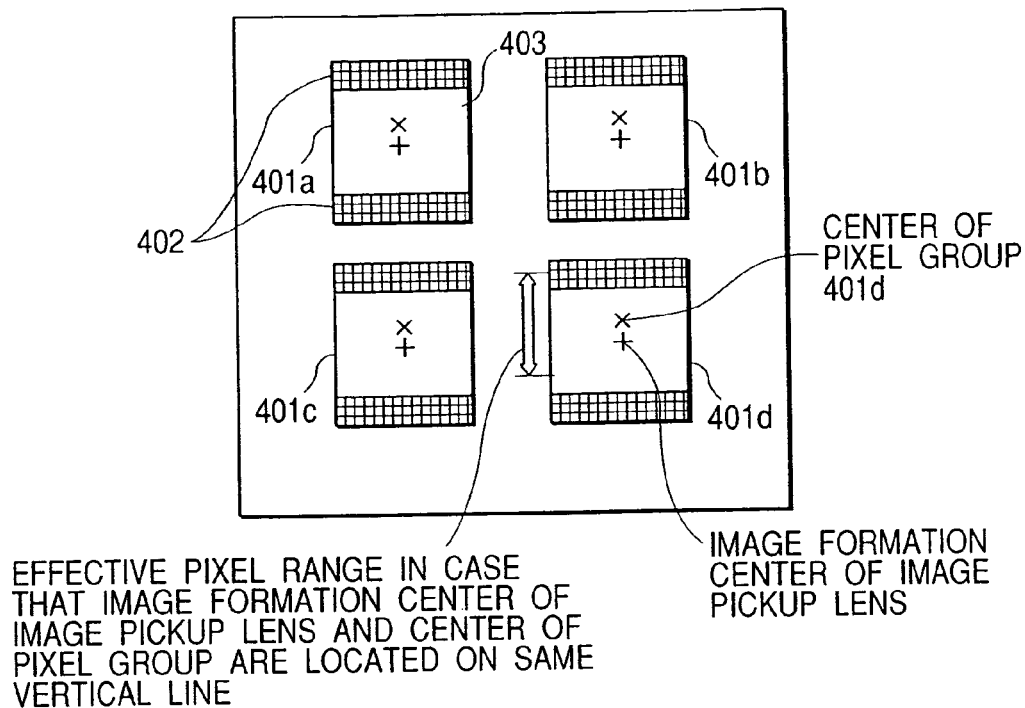
FIG. 15 is a schematic plan view showing the solid-state image pickup element in accordance with the eighth embodiment of the present invention.
Figure 16:
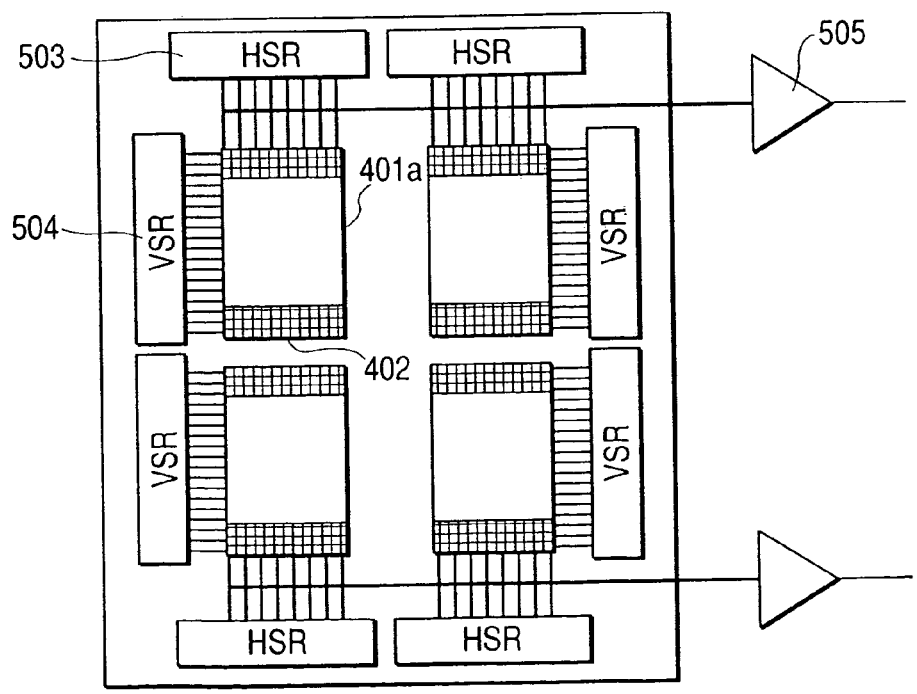
FIG. 16 is a schematic plan view showing the solid-state image pickup element in accordance with the eighth embodiment of the present invention.

FIGS. 15 and 16 are schematic views showing a configuration of a solid-state image pickup element of an eighth embodiment of the present invention. FIG. 15 is a plan view of the solid-state image pickup element of this embodiment and shows a so-called four-eye type solid-state image pickup element. As shown in FIG. 11, an image pickup apparatus is configured with image pickup lenses arranged in front of the solid-state image pickup element.

In FIG. 15, reference numerals 401 and 402 denote image pickup areas in which photoelectric conversion elements for converting incident light to an electric signal are arranged two-dimensionally. More specifically, reference symbols 401a to 401d denote pixel groups, 402 denotes pixel groups (which will be redundant pixel groups) provided in the column direction for adjusting a position of the center of the pixel groups of the solid-state image pickup element, and 403 denotes one pixel forming the pixel groups 401a to 401d. The pixel configuration is the same as that shown in FIG. 14. In the figure, "+" shows an image formation center of each image pickup lens and "x" shows the center of each pixel group.

FIG. 16 is a plan view showing the case in which the solid-state image pickup elements of FIG. 15 have reading out circuits. In FIG. 16, reference symbols 401a to 401d denote pixel groups (in the figure, reference symbols 401b to 401d are omitted), 402 denotes pixel groups provided in the column direction for adjusting a position of the center of the pixel groups of the solid-state image pickup element, 503 denotes horizontal shift registers (HSRs) for reading out outputs from the pixel groups, 504 denotes vertical shift registers (VSRs) for reading out outputs from the pixel groups, and 505 denotes amplifiers for amplifying the outputs read out from the pixel groups. An electric signal is transferred from the photo diode to the floating diffusion area by the vertical shift registers (VSRs) 504 shown in FIG. 16 and amplified by the MOS transistor, and then the electric signal is outputted to the vertical output line. The signal is read out by the horizontal shift registers (HSRs) 503 of FIG. 16 and amplified by the amplifiers 505.

The image pickup apparatus of this embodiment has the four pixel groups 401a to 401d provided with four filters of R, G1, G2 and B and causes incident light to enter the pixel 403 forming each pixel group 401a to 401d through image pickup lenses.

When assembling the solid-state image pickup element as shown in FIG. 15 and image pickup lenses, in order to align the center of each pixel group and the center of each image pickup lens, an effective pixel range is set from the pixel group 401a and the pixel group 402 provided in this embodiment, whereby it becomes possible to easily align the center of each pixel group and the center of each image pickup lense and efficiency of assembly can be increased. This is effective for assembly with large deviation in the horizontal direction in this embodiment. In addition, the pixels that are not used as effective pixels among the pixels of the pixel group 402 also photoelectrically convert incident light to output electric signals. The optical output signals are read out by the vertical shift registers 504 and the horizontal shift registers 503, amplified by the amplifiers 505 and outputted to a signal processing unit for forming an image. However, it is sufficient to idly read the signals from the pixels not used as image information and not to take them in as image information. Then, signals from the pixels used as image information is subjected to various processings such as color processing and processed signals are outputted to a display, a memory or the like.

In addition, any sensor such as an amplified MOS imager (AMI), a charge modulation device (CMD) and a CCD may be used other than a so-called CMOS sensor shown in FIG. 14.

Figure 17:
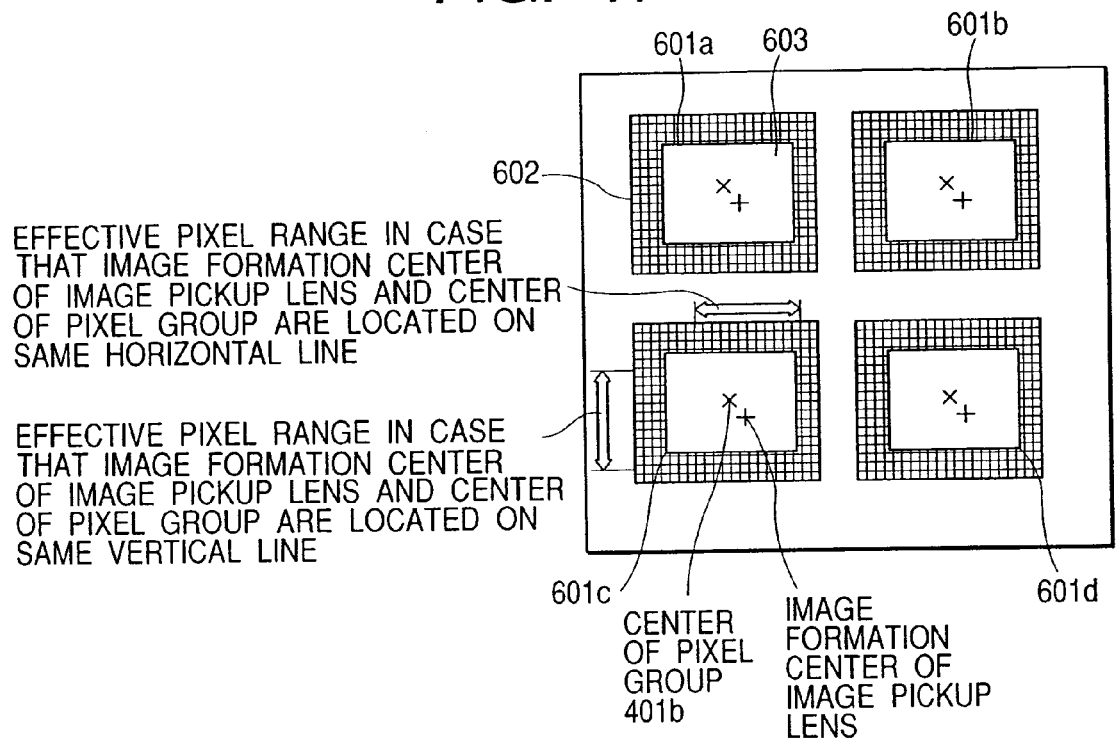
FIG. 17 is a schematic plan view showing the solid-state image pickup element in accordance with the ninth embodiment of the present invention.
Figure 18:
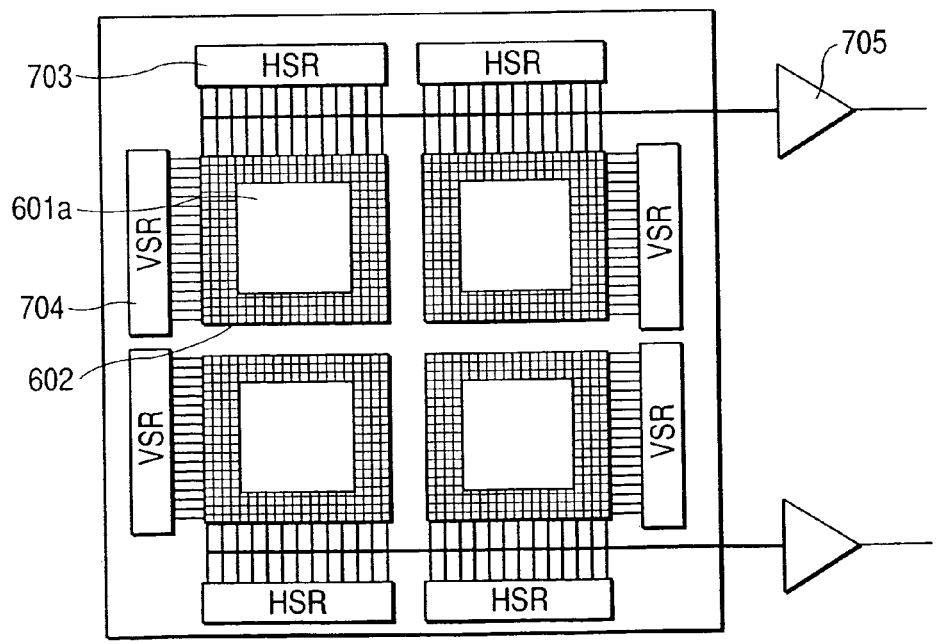
FIG. 18 is a schematic plan view showing the solid-state image pickup element in accordance with the ninth embodiment of the present invention.

FIGS. 17 and 18 are schematic views showing a configuration of a solid-state image pickup element of a ninth embodiment of the present invention. FIG. 17 is a plan view of the solid-state image pickup element of this embodiment and shows a so-called four-eye type solid-state image pickup element. As shown in FIG. 11, an image pickup apparatus is configured with image pickup lenses arranged in front of the solid-state image pickup element.

In FIG. 17, reference numerals 601 and 602 denote image pickup areas in which photoelectric conversion elements for converting incident light to an electric signal are arranged two-dimensionally. More specifically, reference symbols 601a to 601d denote pixel groups, 602 denotes pixel groups (which will be redundant pixel groups) provided in line and column directions for adjusting a position of the center of the pixel groups of the solid-state image pickup element, and 603 denotes one pixel forming the pixel groups 601a to 601d. The pixel configuration is the same as that shown in FIG. 14. In FIG. 17, "+" shows an image formation center of each image pickup lens and "x" shows the center of each pixel group.

FIG. 18 is a plan view showing the case in which the solid-state image pickup element of FIG. 17 has reading out circuits. In FIG. 18, reference symbols 601a to 601d denote pixel groups (in the figure, reference symbols 601b to 601d are omitted), 602 denotes pixel groups provided in row and column directions for adjusting a position of the center of the pixel groups of the solid-state image pickup element, 703 denotes horizontal shift registers (HSR) for reading out outputs from the pixel groups, 704 denotes vertical shift registers (VSR) for reading out outputs from the pixel groups, and 705 denotes amplifiers for amplifying the outputs read out from the pixel groups.

An electric signal is transferred from the photo-diode to the floating diffusion area by the vertical shift registers (VSR) 704 shown in FIG. 18, and amplified by the MOS transistor, and then the electric signal is outputted to the vertical output line. The signal is read out by the horizontal shift registers (HSR) 703 of FIG. 18 and amplified by the amplifiers 705.

The image pickup apparatus of this embodiment has the four pixel groups 601a to 601d provided with four filters of R, G1, G2 and B and causes incident light to enter the pixel 603 forming each pixel group 601a to 601d through image pickup lenses.

In assembling the solid-state image pickup element as shown in FIG. 17 and image pickup lenses, in order to align the center of each pixel group and the center of each image pickup lens, an effective pixel range is set from the pixel group 601a and the pixel group 602 provided in this embodiment, whereby it becomes possible to easily align the center of each pixel group and the center of each image pickup lense and efficiency of assembly can be increased. This is effective for assembly with large deviation in the horizontal and vertical directions in this embodiment. In addition, the pixels that are not used as effective pixels among the pixels of the pixel group 602 also photoelectrically convert incident light to output electric signals. The photo output signals are read out by the vertical shift registers 704 and the horizontal shift registers 703, amplified by the amplifiers 705 and outputted to a signal processing unit for forming an image. However, it is sufficient to idly read the signals from the pixels that are not used as image information and not to take them in as image information. Then, signals from the pixels used as image information are subjected to various processing such as color processing and processed signals are outputted to a display, a memory or the like.

In addition, any sensor such as an amplified MOS imager (AMI), a charge modulation device (CMD) and a CCD may be used other than a so-called CMOS sensor shown in FIG. 14.

Figure 19:
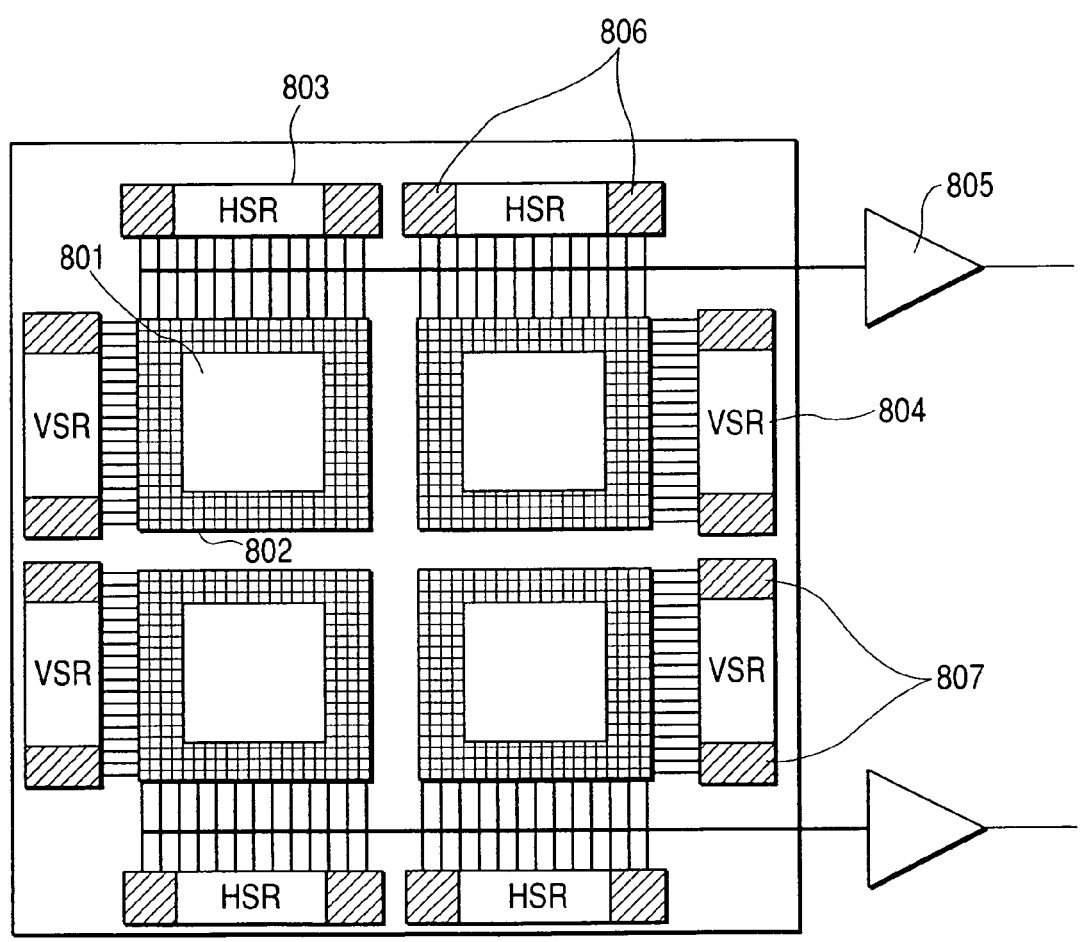
FIG. 19 is a schematic plan view showing the solid-state image pickup element in accordance with a tenth embodiment of the present invention.

FIG. 19 is a plan view of a configuration of a tenth embodiment in which a solid-state image pickup element has a reading out circuit. In FIG. 19, reference numerals 801 and 802 denote image pickup areas in which photoelectric conversion elements for converting incident light to an electric signal are arranged two-dimensionally. More specifically, reference numeral 801 denotes pixel groups, 802 denotes pixel groups (which will be redundant pixel groups) provided for adjusting a position of the center of the pixel groups of the solid-state image pickup element, 803 denotes horizontal shift registers (HSRs) for reading out outputs from the pixel groups, 804 denotes vertical shift registers (VSRs) for reading out outputs from the pixel groups, 805 denotes amplifiers for amplifying the outputs read out from the pixel groups, 806 denotes horizontal decoders for reading out outputs from the pixel groups, which are provided for adjusting a position of the center of the pixel groups in the horizontal direction, and 807 denotes vertical decoders for reading out outputs from the pixel groups, which are provided for adjusting a position of the center of the pixel groups in the vertical direction. An electric signal is transferred from the photo diode to the floating diffusion area by the vertical shift registers (VSRs) 804 and the vertical decoders 807, and amplified by the MOS transistor, and then the electric signal is outputted to the vertical output line. The signal is read out by the horizontal shift registers (HSRs) 803 and the horizontal decoder 806 and amplified by the amplifiers 805.

The image pickup apparatus of this embodiment has the four pixel groups provided with four filters of R, G1, G2 and B and causes incident light to input into the pixel forming each pixel group through image pickup lenses. In assembling the solid-state image pickup element and image pickup lenses, an effective pixel range is set from the pixel group 801 provided for aligning the center of each pixel group and the center of each image pickup lens and the pixel group 802 provided in this embodiment, whereby it becomes possible to easily align the center of each pixel group and the center of each image pickup lense and efficiency of assembly can be increased. This is effective for assembly with large deviation in the horizontal or the vertical direction in this embodiment. In addition, outputs are read out from the pixel group 801 by the horizontal shift registers and the vertical shift registers and only pixels to be used an effective pixel among the pixel group 802 are read out by the horizontal decoders and the vertical decoders, whereby a reading out time of outputs from the solid-state image pickup apparatus can be shortened. Thereafter, processing for forming an image in a signal processing unit is performed. Then, a processed signal is outputted to a display, a memory or the like.

If a pixel group like the pixel group 801 provided for aligning the center of each pixel group and the center of each image pickup lens is provided in the row direction, in order to align the center of each pixel group and the center of each image pickup lens, an effective pixel range is set from the pixel group 801 and the pixel group 802 provided in this embodiment, whereby it becomes possible to easily align the center of each pixel group and the center of each image pickup lense and efficiency of assembly can be increased. If a pixel group like the pixel group 802 is provided in the horizontal direction in this embodiment, this is effective for a method of assembly with large deviation in the horizontal direction. In addition, if a pixel group like the pixel group 802 is provided in the vertical direction, this is effective for assembly with large deviation in the vertical direction. Further, if a pixel group like the pixel group 802 is provided in the horizontal and the vertical direction, this is more effective for assembly with large deviation in the horizontal direction and the vertical direction.

In addition, any sensor such as an amplified MOS imager (AMI), a charge modulation device (CMD) and CCD may be used other than a so-called CMOS sensor shown in FIG. 14.

An eleventh embodiment that is the case in which the solid-state image pickup element of the present invention is applied to a still camera will be described in detail with reference to FIG. 23.

Figure 23:
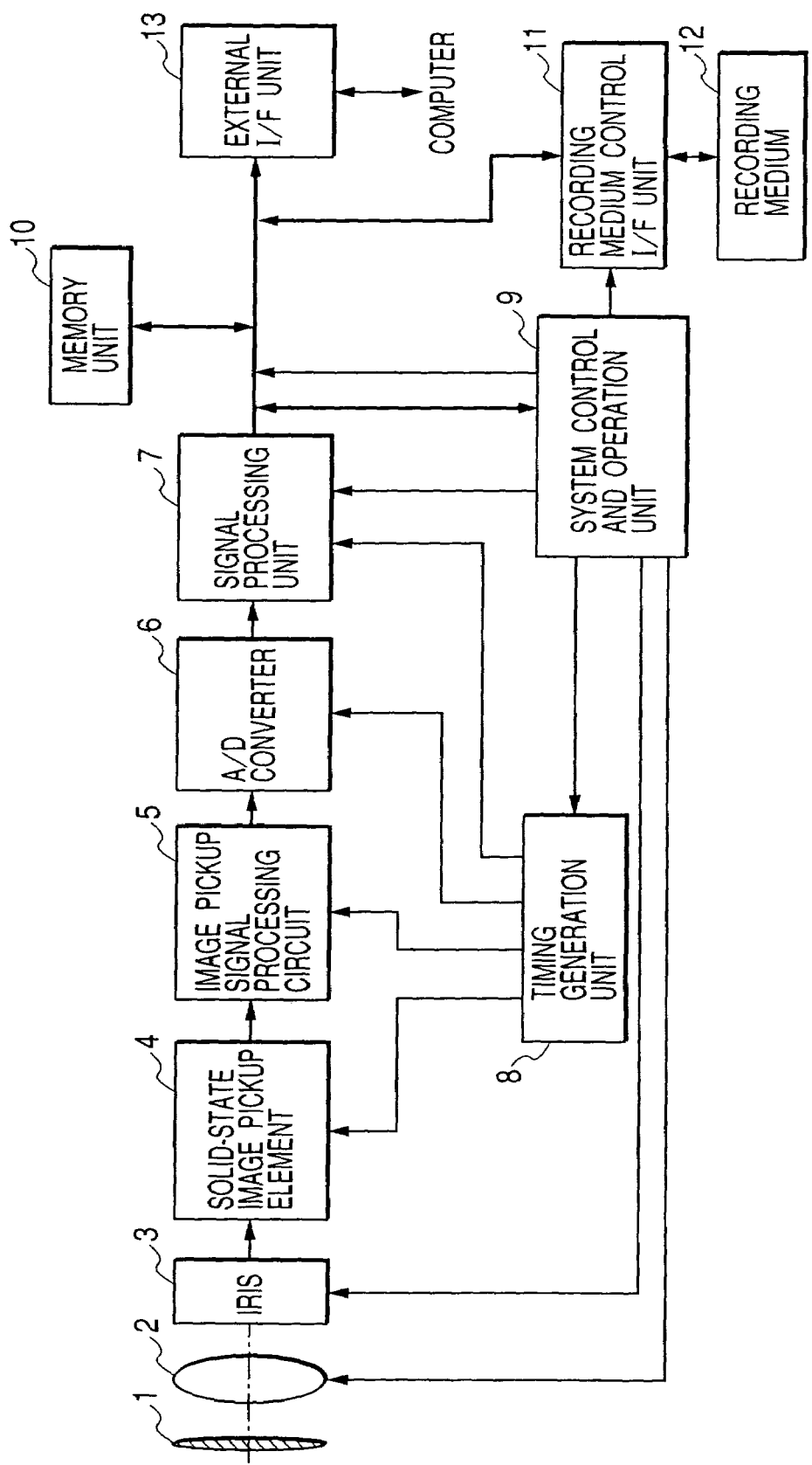
FIG. 23 is a block diagram showing a case in which the solid-state image pickup element according to any one of the first to the tenth embodiments is applied to a digital camera (image pickup apparatus).

FIG. 23 is a block diagram showing the case in which the solid-state image pickup element of any one of the first to the tenth embodiments is applied to a digital still camera (image pickup apparatus).

In FIG. 23, reference numeral 1 denotes a barrier functioning as both a protect and a main switch for a lens, 2 denotes a lens for forming an optical image of a subject on a solid-state image pickup element 4, 3 denotes an iris for varying an amount of light that passed through the lens 2, and 4 denotes a solid-state image pickup element for picking up the image of the subject formed by the lens 2 as an image signal. Further, the solid-state image pickup element 4 is a compound-eye type solid-state image pickup element and has four image pickup areas provided with the above-mentioned color filters of R, G1, G2 and B. As shown in FIG. 11, the lens 2 is provided in association with each image pickup area. Reference numeral 6 denotes an A/D converter for performing analog-digital conversion of an image signal outputted from the solid-state image pickup element 4, 7 denotes a signal processing unit for applying various corrections to image data outputted from the A/D converter 6 and compressing data, 8 denotes a timing generation unit for outputting various timing signals to the solid-state image pickup element 4, an image pickup signal processing circuit 5, the A/D converter 6 and the signal processing unit 7, 9 denotes a system control and operation unit for controlling various operations and the entire digital still camera, 10 denotes a memory unit for temporarily storing image data, 11 denotes an interface unit for recording or reading out image data in or from a recording medium, 12 denotes a detachable recording medium such as a semiconductor memory for recording or reading out image data, and 13 denotes an interface unit for communicating with an external computer or the like.

Next, operations of the digital still camera of the aforementioned configuration at the time of photographing will be described.

When the barrier 1 is opened, a main power source is turned on, a power source of a control system is turned on next and a power source of an image pickup system circuit such as the A/D converter 6 is further turned on. Subsequently, in order to control an amount of exposure, the system control and operation unit 9 opens the iris 3. A signal outputted from the solid-state image pickup element 4 is converted by the A/D converter 6 and then inputted into the signal processing unit 7. Then, an operation for exposure is performed by the system control and operation unit 9. Here, in the seventh to the ninth embodiments, processing as described below is performed in the signal processing unit 7.

In the signal processing unit 7, as described in the first embodiment, for example, pixels that are not used as effective pixels among the pixels of the image pickup area 102 also photoelectrically convert incident light and output electric signals. The photo output signals are read out by the vertical shift registers 204 and the horizontal shift registers 203, amplified by the amplifier 205 and outputted to the signal processing unit 7. Signals from pixels not used as image information are idly read in the signal processing unit 7 and are subjected to processing for not taking them as image information. Then, signals from pixels used as image information are subjected to various kinds of processing such as color processing. The operation for exposure is performed in the system control and operation unit 9 based on the data of the processing.

Brightness is determined based on a result of this photometry and the system control and operation unit 9 controls the iris 3 according to the result.

Next, a high frequency component is extracted from the signal outputted from the solid-state image pickup element 4 to calculate a distance to a subject in the system control and operation unit 9. Thereafter, the lens 2 is driven to determine if it is at a focusing position or not and, if it is determined that the lens 2 is not at the focusing position, the lens 2 is driven again to perform measurement of the distance. Then, the main exposure is started after the in-focus is confirmed.

When the exposure ends, the image signal outputted from the solid-sate image pickup element 4 is A/D converted by the A/D converter 6, sent through the signal processing unit 7 and written into the memory unit 10 by the system control and operation unit 9.

Thereafter, data accumulated in the memory unit 10 is sent through the recording medium control I/F unit 11 and recorded in the detachable recording medium 12 such as a semiconductor memory by the control of the system control and operation unit 9.

In addition, processing of an image may be performed by inputting the data directly into a computer or the like through the external I/F unit 13.

As many apparently widely different embodiments of the present invention can be made without departing from the spirit and scope thereof, it is to be understood that the invention is not limited to the specific embodiments thereof except as defined in the appended claims.

What is claimed is:

1. A solid state image pickup apparatus, comprising:
    a plurality of pixel areas arranged two-dimensionally, each of the pixel areas having a photoelectric conversion element for converting an incident light into an electric signal; and
    an optical focusing system for focusing the incident light into each of the pixel areas,
    wherein at least one of the pixel areas has a redundant pixel group at an inner periphery area within the at least one of the pixel areas, and has an effective pixel area at an inside of the redundant pixel group, and
    wherein when a focus center position of the optical focusing system and the center position of a group of the pixels are misaligned, an output signal from the redundant pixel group is used.

2. An image pickup system comprising the solid state image pickup apparatus according to claim 1, and a signal processing circuit for processing the electric signal from the solid state image pickup apparatus.

* * * * *